United States Patent
Kubo et al.

(10) Patent No.: US 10,879,692 B2
(45) Date of Patent: Dec. 29, 2020

(54) SEMICONDUCTOR DEVICE AND ELECTRONIC CONTROL SYSTEM HAVING THE SAME

(71) Applicant: Renesas Electronics Corporation, Tokyo (JP)

(72) Inventors: Kazuaki Kubo, Tokyo (JP); Koichiro Hashimoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 437 days.

(21) Appl. No.: 15/858,089

(22) Filed: Dec. 29, 2017

(65) Prior Publication Data

US 2018/0248365 A1   Aug. 30, 2018

(30) Foreign Application Priority Data

Feb. 24, 2017   (JP) ................................. 2017-033217

(51) Int. Cl.
*H02H 9/04* (2006.01)
*H03K 17/082* (2006.01)
(Continued)

(52) U.S. Cl.
CPC .............. *H02H 9/041* (2013.01); *H02H 1/04* (2013.01); *H03K 17/0822* (2013.01); *H03K 17/64* (2013.01)

(58) Field of Classification Search
CPC ...... H02H 1/04; H02H 9/041; H03K 17/0822; H03K 17/64
(Continued)

(56) References Cited

U.S. PATENT DOCUMENTS 4,862,233 A * 8/1989 Matsushita ......... H01L 27/0922
257/328
6,064,249 A * 5/2000 Duvvury ............. H01L 27/0255
327/314
(Continued)

FOREIGN PATENT DOCUMENTS

EP    2 819 168 A1   12/2014
JP   2005-109162 A    4/2005
(Continued)

OTHER PUBLICATIONS

European Search Report dated Jul. 10, 2018 for European Patent Appliction No. 17209044 1-1203.
(Continued)

*Primary Examiner* — Kevin J Comber
(74) *Attorney, Agent, or Firm* — McDermott Will & Emery LLP

(57) ABSTRACT

There is a need to provide a semiconductor device and an electronic control system including the same while the semiconductor device is capable of continuing normal operation even when a negative surge voltage is applied. According to an embodiment, a driver IC includes an output transistor, a driver control circuit, a negative potential clamp circuit, and an ESD protection circuit. The output transistor is provided between a battery voltage terminal and an output terminal coupled to a load. The driver control circuit switches on-off state of the output transistor by controlling a gate voltage of the output transistor with reference to a voltage of the output terminal. The negative potential clamp circuit turns on the output transistor regardless of control from the control circuit when a negative voltage lower than a predetermined voltage is applied to the output terminal. The ESD protection circuit is provided between battery the voltage terminal and the reference voltage terminal and
(Continued)

enters a conduction state when a surge voltage is applied to the battery voltage terminal.

17 Claims, 18 Drawing Sheets

(51) Int. Cl.
    *H03K 17/64*     (2006.01)
    *H02H 1/04*     (2006.01)

(58) Field of Classification Search
    USPC .......................................................... 361/56
    See application file for complete search history.

(56) References Cited

U.S. PATENT DOCUMENTS

| | | | |
|---|---|---|---|
| 6,385,028 | B1 | 5/2002 | Kouno |
| 2005/0068705 | A1 | 3/2005 | Nakahara |
| 2007/0279106 | A1* | 12/2007 | Bennett .............. H03K 17/166 327/110 |
| 2013/0127500 | A1 | 5/2013 | Kobayashi et al. |
| 2015/0123637 | A1 | 5/2015 | Iwamizu |
| 2016/0311327 | A1 | 10/2016 | Nakahara et al. |
| 2016/0336308 | A1 | 11/2016 | Esmark et al. |

FOREIGN PATENT DOCUMENTS

| | | |
|---|---|---|
| JP | 2015-091211 A | 5/2015 |
| JP | 2016-208406 A | 12/2016 |

OTHER PUBLICATIONS

Japanese Notice of Reasons for Refusal issued in corresponding Japanese Patent Application No. 2017-033217, dated Aug. 18, 2020, with English translation.

* cited by examiner

SEMICONDUCTOR DEVICE AND ELECTRONIC CONTROL SYSTEM HAVING THE SAME

CROSS-REFERENCE TO RELATED APPLICATIONS

The disclosure of Japanese Patent Application No. 2017-033217 filed on Feb. 24, 2017 including the specification, drawings and abstract is incorporated herein by reference in its entirety.

BACKGROUND

The present invention relates to a semiconductor device and an electronic control system including the same and more particularly to a semiconductor device capable of continuing normal operation despite application of a negative surge voltage and an electronic control system including the semiconductor device.

A vehicle such as an automobile or a motorcycle is mounted with an electronic control unit (ECU) that electronically controls an engine. The electronic control unit includes a driver IC (integrated circuit) that drives inductive loads on a solenoid included in the engine. The driver IC includes an output transistor and a control circuit. The output transistor is provided along a power supply path from a battery power supply (power supply source) to the load. The control circuit controls on-off operation of the output transistor.

Recently, there is an increasing use of driver ICs as high-side drivers. The high-side driver uses an output transistor as a high-side switch between the battery power supply and a load. The battery power supply is provided at the output transistor side when the driver IC is used as a high-side driver. A reference voltage source (ground voltage source) is provided at the load side. It is therefore possible to reduce efforts to wire a power cable around the load.

Suppose the output transistor is changed from on state to off state to stop supplying the power to the inductive load from the battery power supply. The high-side driver then discharges an electromagnetic energy stored in the load to generate a negative inverse voltage (surge voltage). For example, the configuration disclosed in patent literature 1 provides a clamp circuit to clamp an inverse voltage on to a predetermined clamp voltage in order to prevent the output transistor from being destroyed due to the inverse voltage.

RELATED ART LITERATURES

Patent Literature

Japanese Unexamined Patent Application Publication No. 2016-208406

SUMMARY

The high-side driver can efficiently discharge the electromagnetic energy from the load in a short period of time if the normal operation can continue without destroying the output transistor due to an increased negative surge voltage.

According to the configuration described in patent literature 1, however, the clamp circuit clamps a large negative surge voltage, if applied, to the clamp voltage and therefore disables the normal operation from continuing. A large negative surge voltage may destroy the output transistor if a large value is given to the clamp voltage configured by the clamp circuit. These and other objects and novel features may be readily ascertained by referring to the following description of the present specification and appended drawings.

A semiconductor device according to an embodiment includes an output transistor, a control circuit, a negative potential clamp circuit, and a surge protection circuit. The output transistor is provided between an input terminal supplied with electric power from outside and an output terminal coupled to a load. The control circuit switches on-off state of the output transistor by controlling a gate voltage of the output transistor with reference to a voltage at the output terminal. The negative potential clamp circuit turns on the output transistor regardless of control from the control circuit when a negative voltage lower than a predetermined voltage is applied to the output terminal. The surge protection circuit is provided between the input terminal and the reference voltage terminal and enters a conduction state when a surge voltage is applied to the input terminal.

According to another embodiment, a semiconductor device includes an output transistor, a control circuit, a negative potential clamp circuit, and a surge protection circuit. The output transistor is provided between a first external coupling terminal and a second external coupling terminal. The control circuit switches on-off state of the output transistor by controlling a gate voltage of the output transistor with reference to a voltage of the second external coupling terminal. The negative potential clamp circuit turns on the output transistor regardless of control from the control circuit when a negative voltage lower than a predetermined voltage is applied to the second external coupling terminal. The surge protection circuit is provided between the first external coupling terminal and a reference voltage terminal and enters conduction state when a surge voltage is applied to the first external coupling terminal.

The above-mentioned embodiment can provide a semiconductor device and an electronic control system including the same while the semiconductor device is capable of continuing normal operation even when a negative surge voltage is applied.

DETAILED DESCRIPTION

Figure 1:
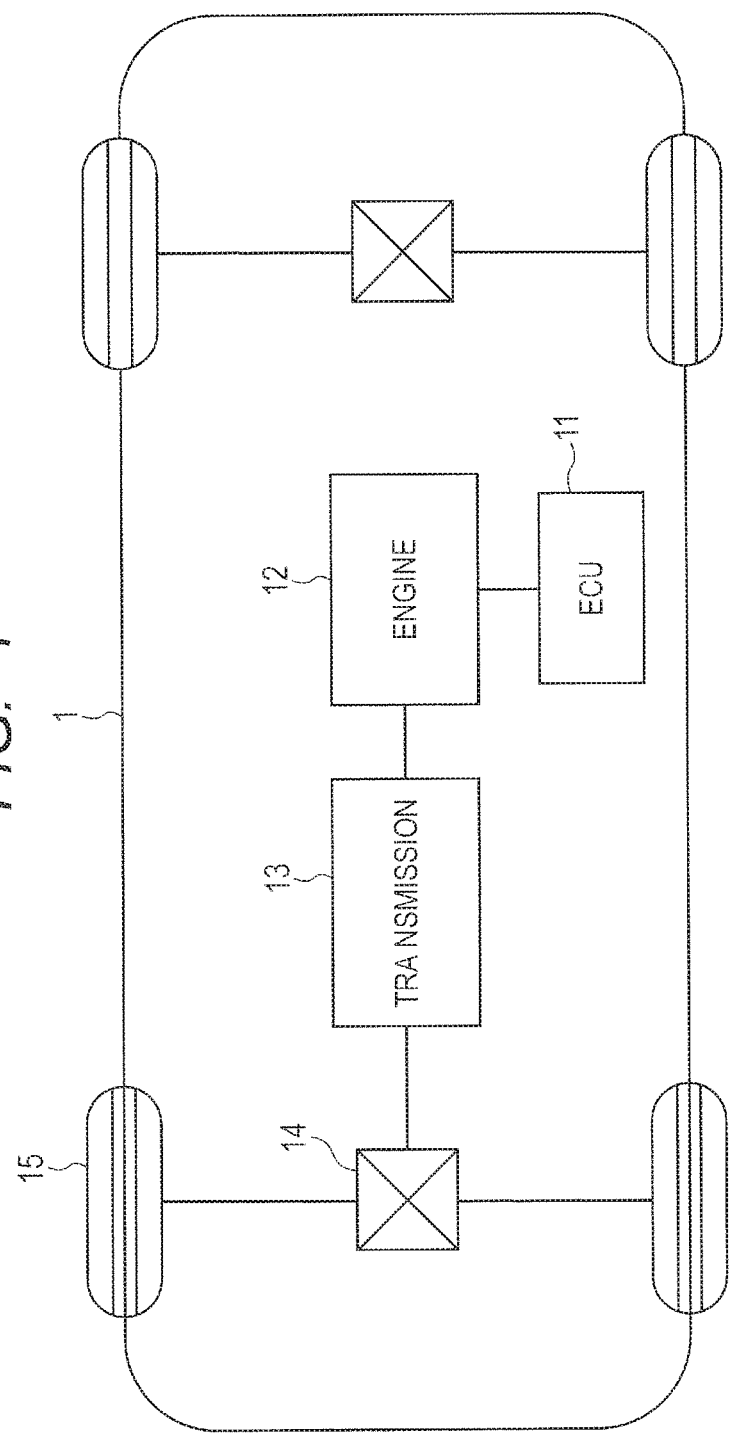
FIG. 1 illustrates an external view of a vehicle mounted with the electronic control unit according to a first embodiment.

Embodiments will be described in further detail with reference to the accompanying drawings. The drawings are schematic and the technical scope of the embodiments therefore should not be interpreted in a restricted sense based on the description of the drawings. The same components in the drawings are depicted by the same reference numerals and a redundant description is omitted for simplicity.

The description below may divide the embodiment into a plurality of sections or embodiments as needed. Unless explicitly specified, the divisions are not unrelated to each other. One provides a modification, an application, a detailed explanation, or a supplementary explanation about all or part of the others. The number of elements (including the number of items, values, quantities, and ranges) referred to in the following embodiment is not limited to a specific value and may be greater or smaller than or equal to the specific value except the number of elements is explicitly specified or is obviously limited to the specific value in principle.

Constituent elements (including operation steps) of the following embodiments are not required unless explicitly specified or obviously required in principle. Similarly, shapes or positional relation of the constituent elements referred to in the following embodiments include those substantially approximate or similar to the shapes unless explicitly specified and obviously considered different in principle. The same applies to the above-mentioned number of elements (including the number of items, values, quantities, and ranges).

First Embodiment

FIG. 1 is an external view of a vehicle mounted with an electronic control unit (ECU) according to the first embodiment.

As illustrated in FIG. 1, for example, a vehicle 1 is mounted with an ECU 11, an engine 12, a transmission 13, a differential gear, and a tire 15. The ECU 11 controls the driving by the engine 12. The engine 12 is coupled to the transmission 13 and transmits a driving force controlled by the ECU 11 to the transmission 13. The transmission 13 is coupled to the differential gear 14. The transmission 13 converts the driving force of the engine 12 into the number of revolutions and the torque corresponding to a traveling state and then transmits the converted driving force to the differential gear 14 to rotate the tire 15.

Figure 2:
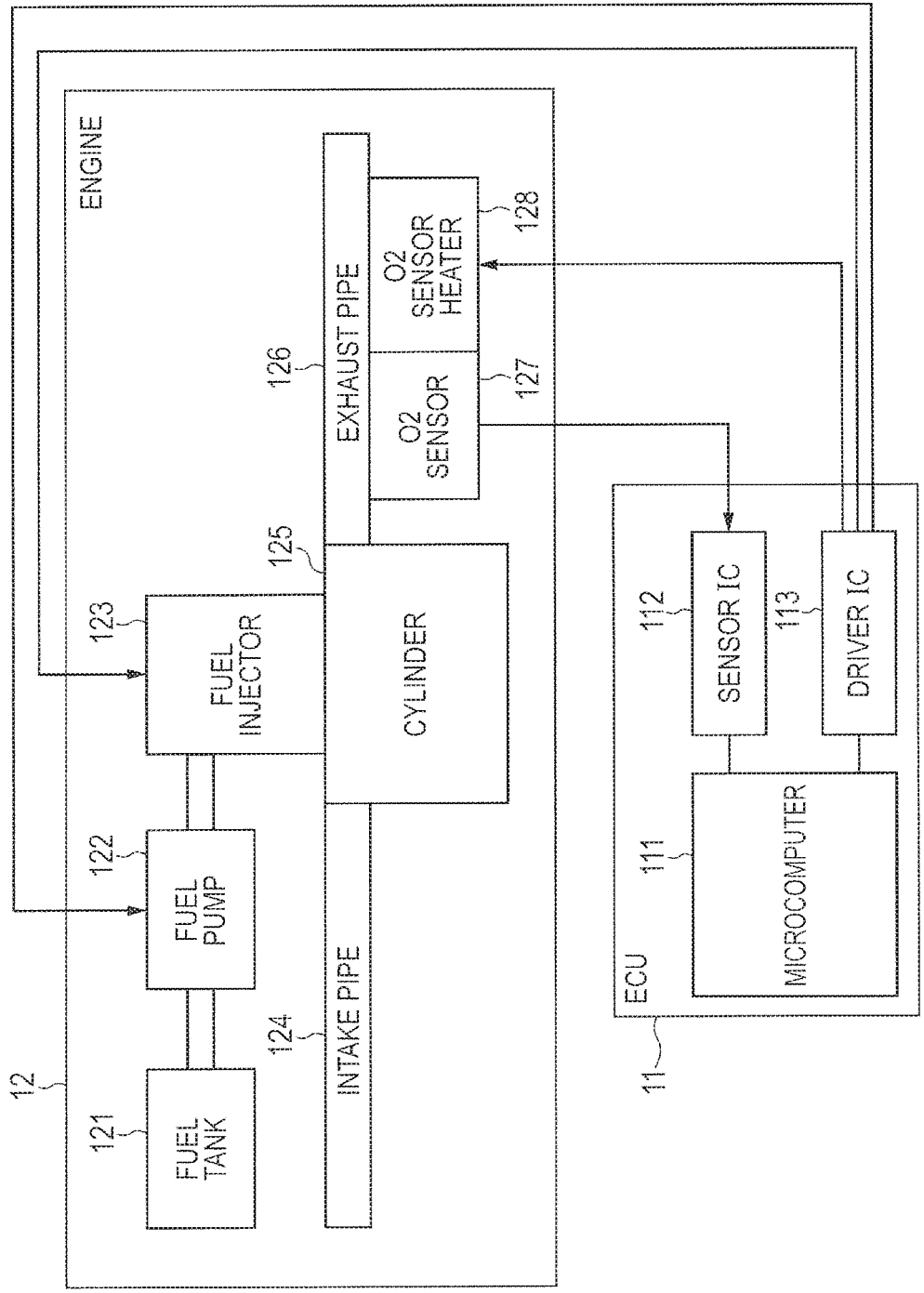
FIG. 2 is a block diagram illustrating a specific typical configuration of the electronic control system provided for the vehicle illustrated in FIG. 1.

FIG. 2 is a diagram illustrating a specific typical configuration of the electronic control system provided for the vehicle 1 illustrated in FIG. 1.

As illustrated in FIG. 2, an electronic control system SYS1 includes the ECU 11 and the engine 12 as a load controlled by the ECU 11. The ECU 11 includes a microcomputer 111, a sensor IC 112, and a driver IC 113. The engine 12 includes a fuel tank 121, a fuel pump 122, a fuel injector 123, an intake pipe 124, a cylinder 125, an exhaust pipe 126, an O2 sensor 127, and an O2 sensor heater 128.

The engine 12 allows the fuel pump 122 to suck the fuel from the fuel tank 121 and supplies the sucked fuel to the fuel injector 123. The fuel injector 123 injects the fuel into the cylinder 125. In the cylinder 125, the fuel injected by the fuel injector 123 burns in response to the air supplied from the outside via the intake pipe 124. A piston in the cylinder 125 thereby moves vertically. Namely, the engine 12 generates a driving force. The exhaust gas after burning is exhausted to the outside via the exhaust pipe 126.

The O2 sensor heater 128 heats the O2 sensor 127. The heated O2 sensor 127 monitors the contained amount of O2 in the exhaust gas passing through the exhaust pipe 126.

In the ECU 11, the sensor IC 112 determines whether the contained amount of O2 is smaller than or equal to a permissible amount, based on the monitoring result of the O2 sensor 127, for example. The microcomputer 111 controls the fuel pump 122, the fuel injector 123, and the O2 sensor heater 128 in the engine by using the driver IC 113 based on the detection result from the sensor IC 112.

Specific Typical Configuration of the Driver IC 113

Figure 3:
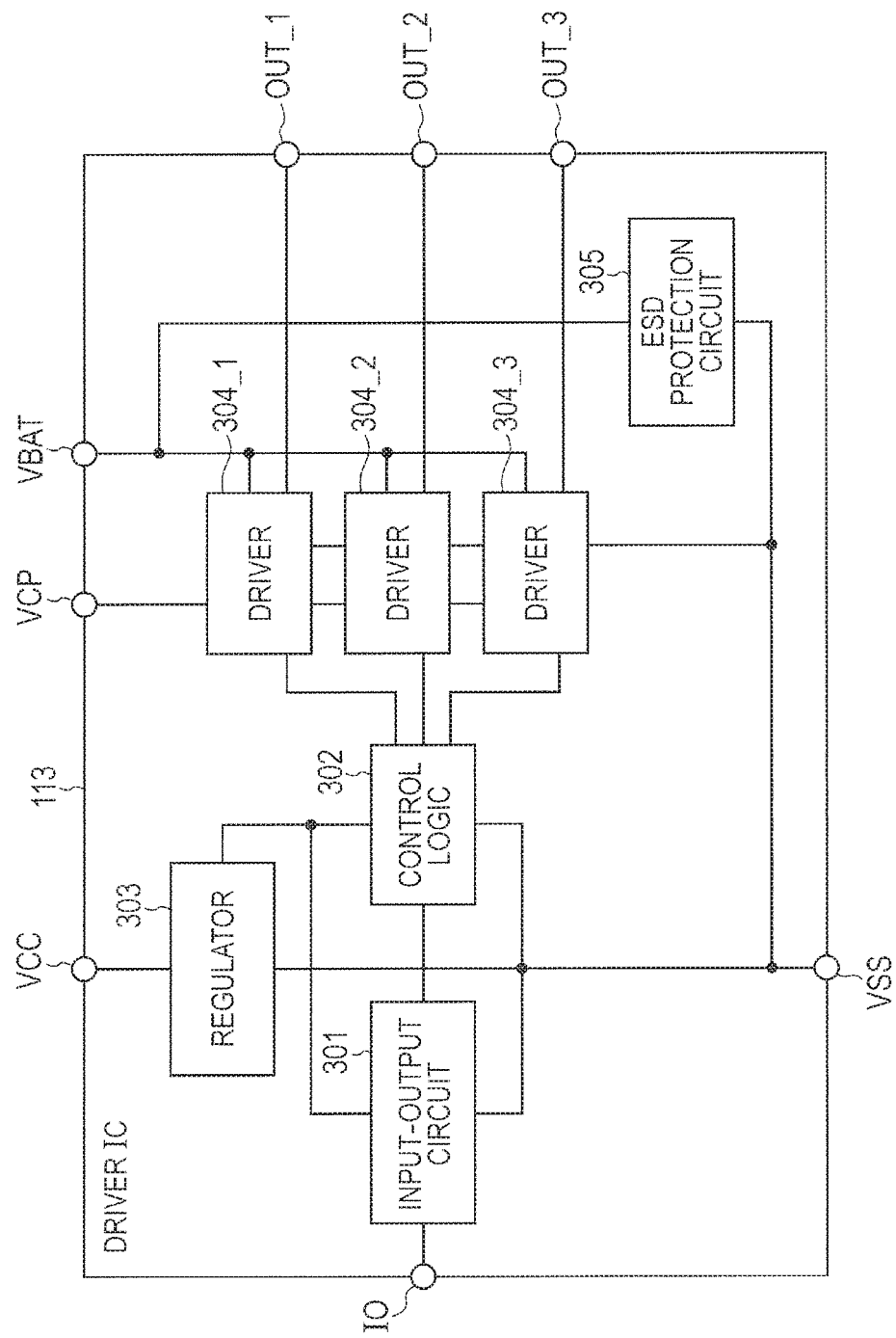
FIG. 3 is a block diagram illustrating a specific typical configuration of a driver IC provided for the electronic control unit illustrated in FIG. 2.

FIG. 3 is a block diagram illustrating a specific typical configuration of the driver IC 113.

As illustrated in FIG. 3, the driver IC 113 includes an input-output circuit 301, a control logic 302, a regulator 303, three drivers 304 (also referred to as drivers 304_1 through 304_3), and an ESD (Electro-Static Discharge) protection circuit 305.

The regulator 303 is provided between a power-supply voltage terminal (hereinafter referred to as power-supply voltage terminal VCC) and a reference voltage terminal (hereinafter referred to as reference voltage terminal VSS) and generates a predetermined internal voltage. Power-supply voltage terminal VCC is supplied with power-supply voltage VCC from a power supply. Reference voltage terminal VSS is supplied with reference voltage VSS from a reference power supply (e.g., grounded power supply).

The input-output circuit 301 communicates with the microcomputer 111 via input-output IO. The control logic 302 controls the drivers 304_1 through 304_3 based on a signal received by the input-output circuit 301 from the microcomputer 111, for example. An internal voltage from the regulator 303 is supplied to a high-potential voltage terminal and reference voltage VSS is supplied to a low-potential voltage terminal in each of the input-output circuit 301 and the control logic 302.

The drivers 304_1 through 304_3 drive loads based on a control signal from the control logic 302. For example, the driver 304_1 drives the fuel pump 122 as a load. The driver 304_2 drives the fuel injector 123 as a load. The driver 304_3 drives the O2 sensor heater 128 as a load.

The drivers 304_1 through 304_3 are coupled to a boost voltage terminal (hereinafter referred to as boost voltage terminal VCP), reference voltage terminal VSS, a battery voltage terminal (hereinafter referred to as battery voltage terminal VBAT), and corresponding output terminal OUT (hereinafter also referred to as output terminals OUT_1 through OUT_3). Boost voltage terminal VCP is supplied with boost voltage VCP resulting from boosting battery voltage VBAT. Battery voltage terminal VBAT is supplied with battery voltage VBAT from the battery power supply (power supply source).

An ESD protection circuit (surge protection circuit) 305 is provided between a high-potential voltage terminal (battery voltage terminal VBAT) and a low-potential voltage terminal (reference voltage terminal VSS) at each of the drivers 304_1 through 304_3. The EDS protection circuit 305 protects the drivers 304_1 through 304_3 from ESD by absorbing a surge voltage such as ESD applied to battery voltage terminal VBAT, for example.

Specific Typical Configuration of the Driver 304

Figure 4:
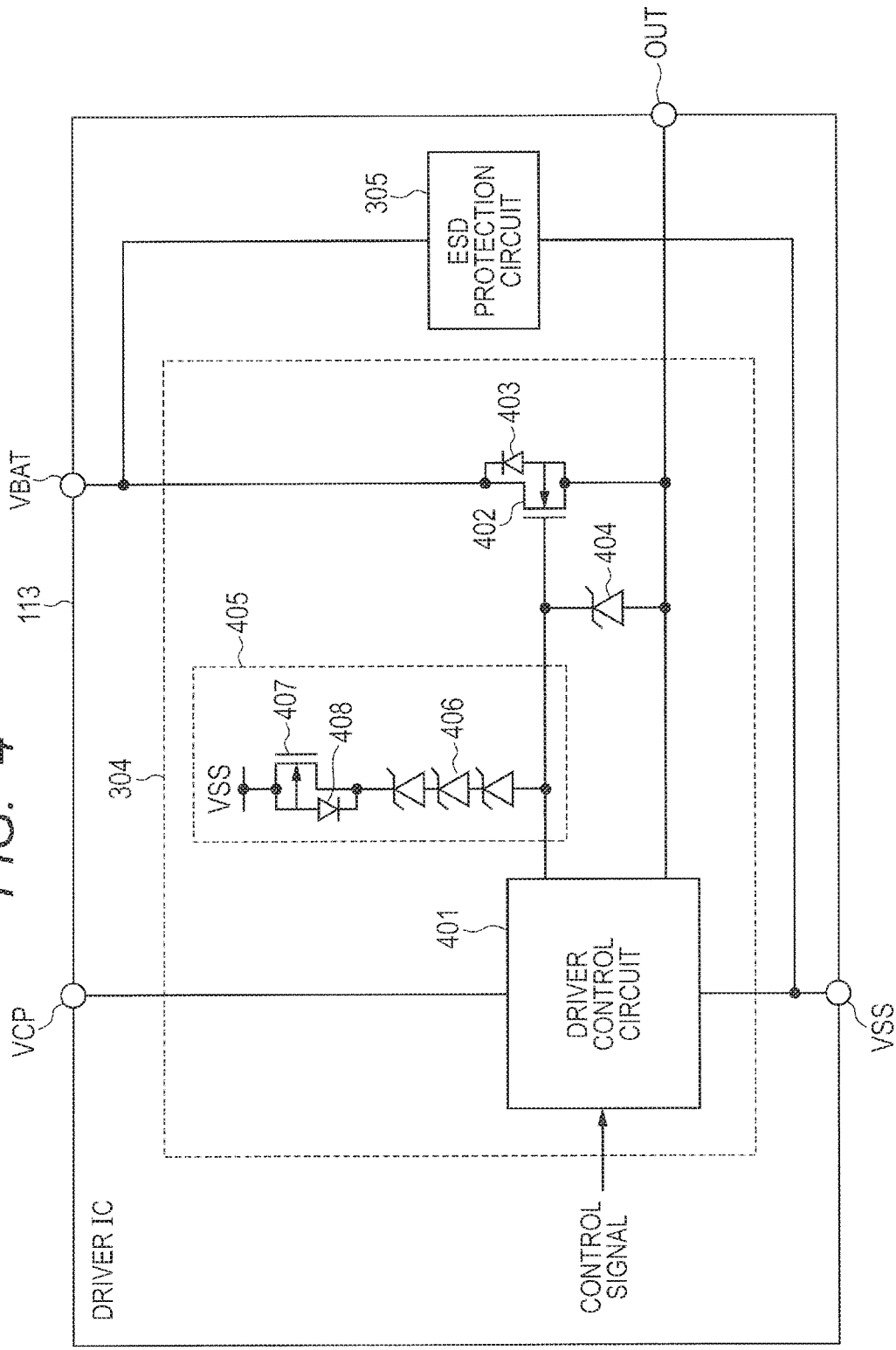
FIG. 4 is a diagram illustrating a specific typical configuration of a driver in the driver IC illustrated in FIG. 3.

FIG. 4 is a diagram illustrating a specific typical configuration of the driver 304 in the driver IC 113. FIG. 4 illustrates the driver 304 and the ESD protection circuit 305 as constituent elements of the driver IC 113.

As illustrated in FIG. 4, the driver 304 includes a driver control circuit 401, an output transistor 402 as an N-channel MOS transistor, a gate protection diode 404, and a negative potential clamp circuit 405. A body diode 403 is formed between the source and the drain of the output transistor 402. The negative potential clamp circuit 405 includes one or more serially coupled Zener diodes 406 and an N-channel MOS transistor 407. A body diode 408 is formed between the source and the drain of the MOS transistor 407.

The output transistor 402 is provided between battery voltage terminal VBAT supplied with a battery voltage and output terminal OUT coupled to the load and switches between the on state and the off state based on control signal CTL from the driver control circuit 401. Namely, the output transistor 402 is used as a high-side switch. The embodiment describes the example using an inductive load as a load coupled to output terminal OUT.

The driver control circuit 401 is provided between boost voltage terminal VCP and reference voltage terminal VSS and outputs control signal CTL to control the on-off state of the output transistor 402 based on a control signal from the control logic 302. Control signal CTL controls a gate-source voltage (a gate voltage with reference to a source voltage) to be higher than or equal to a threshold voltage or lower than the threshold voltage.

Specific Typical Configuration of the Driver Control Circuit 401

Figure 5:
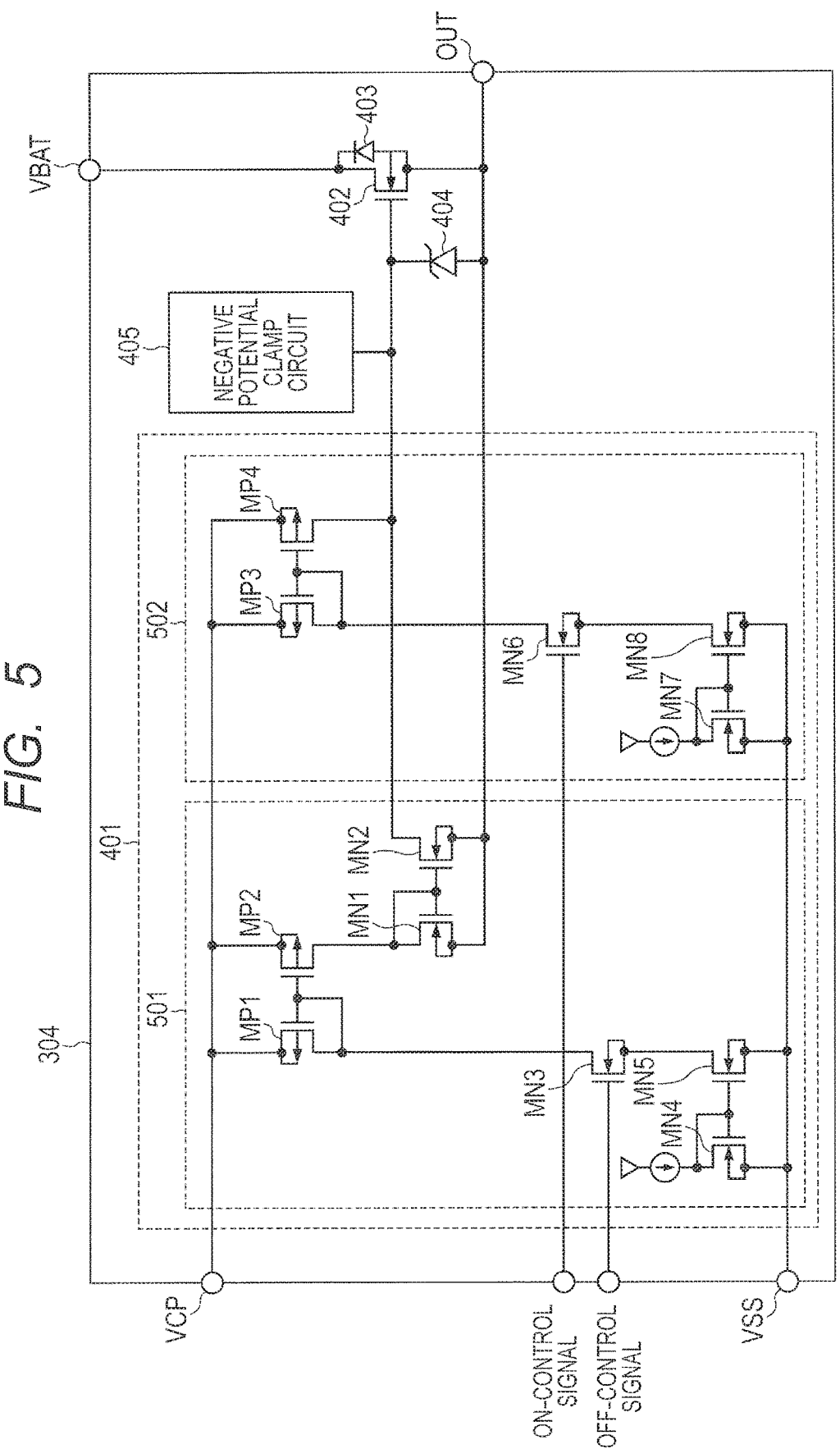
FIG. 5 is a circuit diagram illustrating a specific typical configuration of a driver control circuit in the driver IC illustrated in FIG. 4.

FIG. 5 is a circuit diagram illustrating a specific typical configuration of the driver control circuit 401 in the driver 304.

As illustrated in FIG. 5, the driver control circuit 401 includes an off-control circuit 501 and an on-control circuit 502. The off-control circuit 501 includes P-channel MOS transistors MP1 and MP2, and N-channel MOS transistors MN1 through MN5. The on-control circuit 502 includes P-channel MOS transistors MP3 and MP4, and N-channel MOS transistors MN6 through MN8.

In the off-control circuit 501, MOS transistors MP1, MN3, and MN5 are serially coupled between boost voltage terminal VCP and reference voltage terminal VSS. The gate of the MOS transistor MN3 is supplied with an off-control signal as a control signal from the control logic 302.

In MOS transistor MN4, the source is coupled to reference voltage terminal VSS, and the gate and the drain thereof are coupled to a constant current source and the gate of MOS transistor MN5. Namely, MOS transistors MN4 and MN5 configure a current mirror circuit. A current flowing between the source and the drain of MOS transistor MN5 is therefore proportional to a current flowing between the source and the drain of MOS transistor MN4 while MOS transistor MN3 turns on.

In MOS transistor MP2, the source is coupled to boost voltage terminal VCP, the drain is coupled to the drain of MOS transistor MN1, and the gate is coupled to the gate and the drain of transistor MP1. Namely, MOS transistors MP1 and MP2 configure a current mirror circuit. A current flowing between the source and the drain of MOS transistor MP2 is therefore proportional to a current flowing between the source and the drain of MOS transistor MP1 (i.e., a current flowing between the source and the drain of MOS transistor MP4) while MOS transistor MN3 turns on.

In MOS transistor MN1, the source is coupled to output terminal OUT, and the gate and the drain are each coupled to the drain of MOS transistor MP2 and the gate of MOS transistor MN2. In MOS transistor MN2, the source is coupled to output terminal OUT and the drain is coupled to the gate of the output transistor 402. Namely, MOS transistors MN1 and MN2 configure a current mirror circuit. A current flowing between the source and the drain of MOS transistor MN2 is therefore proportional to a current flowing between the source and the drain of MOS transistor MN1 (i.e., a current flowing between the source and the drain of MOS transistor MN4) while MOS transistor MN3 turns on. At this time, the output transistor 402 turns off because a gate-source voltage is lower than the threshold voltage.

In the on-control circuit 502, MOS transistors MP3, MN6, and MN8 are serially coupled between boost voltage terminal VCP and reference voltage terminal VSS. The gate of MOS transistor MN6 is supplied with an on-control signal as a control signal from the control logic 302. The on-control signal indicates a voltage level contrary to that of an off-control signal, for example. Namely, the on-control signal indicates the L level when the off-control signal remains the H level. The on-control signal indicates the H level when the off-control signal remains the L level.

In MOS transistor MN7, the source is coupled to reference voltage terminal VSS, and the gate and the drain are each coupled to the constant current source and the gate of MOS transistor MN8. Namely, MOS transistors MN7 and MN8 configure a current mirror circuit. A current flowing between the source and the drain of MOS transistor MN8 is therefore proportional to a current flowing between the source and the drain of MOS transistor MN7 while MOS transistor MN6 turns on.

In MOS transistor MP4, the source is coupled to boost voltage terminal VCP, the drain is coupled to the gate of the output transistor 402, and the gate is coupled to the gate and the drain of MOS transistor MP3. Namely, MOS transistors MP3 and MP4 configure a current mirror circuit. A current flowing between the source and the drain of MOS transistor MP4 is therefore proportional to a current flowing between the source and the drain of MOS transistor MP3 (i.e., a current flowing between the source and the drain of MOS transistor MN7) while MOS transistor MN6 turns on. At this time, the output transistor 402 turns on because a gate-source voltage is higher than or equal to the threshold voltage.

The description continues with reference to FIG. 4 again.

The gate protection diode 404 is available as a Zener diode and is provided between the gate and the source of the output transistor 402. Specifically, the anode of the gate protection diode 404 is coupled to the source of the output transistor 402. The cathode of the gate protection diode 404 is coupled to the gate of the output transistor 402.

The gate-source voltage of the output transistor 402 may exceed an allowable voltage. In such a case, the gate protection diode 404 causes breakdown and clamps the gate-source voltage of the output transistor 402 to the allowable voltage or lower. The gate protection diode 404 can thereby prevent an excess voltage from being applied between the gate and the source of the output transistor 402. The gate protection diode 404 need not be provided if a gate insulator film of the output transistor 402 is fully resistant.

Applying a negative voltage (negative surge voltage) to output terminal OUT may cause a potential difference between gate voltage VG and reference voltage VSS of the output transistor 402 to be larger than a predetermined clamp voltage. In such a case, the negative potential clamp circuit 405 clamps gate voltage VG to the clamp voltage. A conduction state takes effect between the gate and the source of the output transistor 402 in the driver control circuit 401 when the output transistor 402 changes from the on state to the off state. The gate voltage and the source voltage of the output transistor 402 are approximately equal. Clamping gate voltage VG to the clamp voltage causes the gate-source voltage of the output transistor 402 to be higher than or equal to the threshold voltage. The output transistor 402 is therefore forced to turn on.

The negative potential clamp circuit 405 is provided with one or more Zener diodes 406 in order to settle a clamp voltage value. The body diode 408 is formed between the source and the drain of the MOS transistor 407 for the purpose of backflow prevention.

Specific Typical Configuration of the ESD Protection Circuit 305

Figure 6:
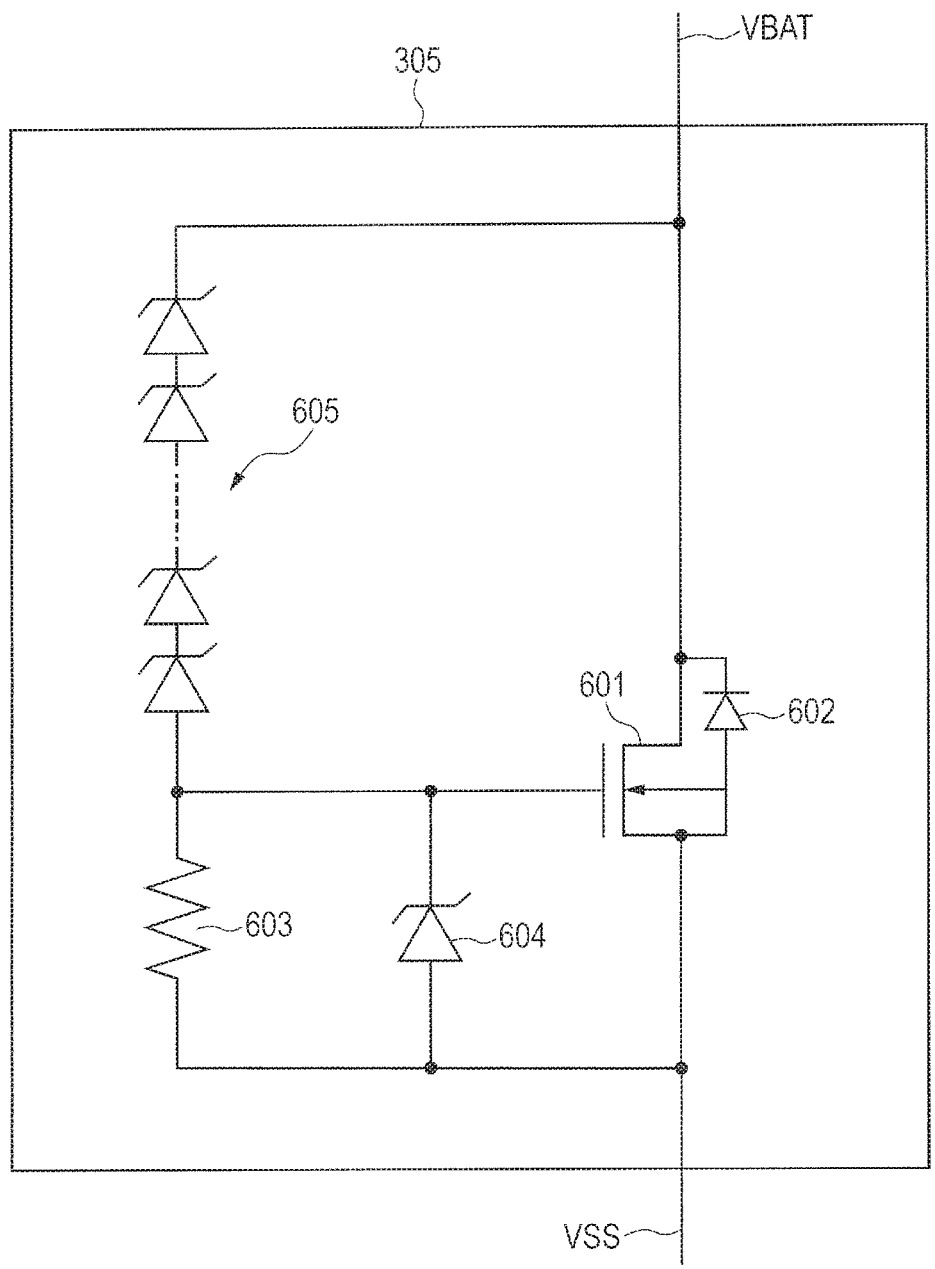
FIG. 6 is a diagram illustrating a specific typical configuration of an ESD protection circuit provided for the driver IC illustrated in FIG. 4.

FIG. 6 is a circuit diagram illustrating a specific typical configuration of the ESD protection circuit 305.

As illustrated in FIG. 6, the ESD protection circuit 305 includes an N-channel MOS transistor 601, a resistive element 603, a gate protection diode 604, and a clamp circuit 605.

The MOS transistor 601 is provided between battery voltage terminal VBAT supplied with the battery voltage and reference voltage terminal VSS. A body diode 602 is formed between the source and the drain of the MOS transistor 601.

The gate protection diode 604 is available as a Zener diode and is provided between the gate and the source of the MOS transistor 601. Specifically, the anode of the gate protection diode 604 is coupled to the source of the MOS transistor 601. The cathode of the gate protection diode 604 is coupled to the gate of the MOS transistor 601.

The gate-source voltage of the MOS transistor 601 may exceed an allowable voltage. In such a case, the gate protection diode 604 causes breakdown and clamps the gate-source voltage of the MOS transistor 601 to the allowable voltage or lower. The gate protection diode 604 can thereby prevent an excess voltage from being applied between the gate and the source of the MOS transistor 601. The gate protection diode 604 need not be provided if a gate insulator film of the MOS transistor 601 is fully resistant.

The clamp circuit 605 is provided between the gate of the MOS transistor 601 and battery voltage terminal VBAT. Specifically, one or more serially coupled Zener diodes configure the clamp circuit 605. The anode side is coupled to the gate of the MOS transistor 601. The cathode side is coupled to battery voltage terminal VBAT.

The clamp circuit 605 clamps a surge voltage such as ESD applied to battery voltage terminal VBAT to a predetermined voltage (clamp voltage) or lower. Specifically, the clamp circuit 605 causes breakdown when the voltage of battery voltage terminal VBAT increases and the gate-drain voltage of the MOS transistor 601 exceeds the clamp voltage. At this time, a breakdown current flows into the resistive element 603. Both ends of the resistive element 603 generate a potential difference greater than or equal to the threshold voltage for the MOS transistor 601. The MOS transistor 601 thereby turns on. The voltage of battery voltage terminal VBAT is thereby clamped to be lower than or equal to the clamp voltage. The ESD protection circuit 305 can thus protect the driver 304 against an excess voltage.

The resistive element 603 is provided between the gate and the source of the MOS transistor 601. The resistive element 603 biases the gate voltage of the MOS transistor 601 toward the source voltage on condition that the clamp circuit 605 does not cause breakdown (non-protected operation state). This can prevent the MOS transistor 601 from turning on unexpectedly in the non-protected operation state.

The resistive element 603 features a high resistance value. The resistive element 603 can thereby increase a voltage drop (current value×resistance value) per given current value. The gate-source voltage of the MOS transistor 601 can fast increase to fast turn on the MOS transistor 601 when the clamp circuit 605 causes breakdown due to application of a surge voltage such as ESD.

Protection Operation of the Driver IC 113 Against Surge Voltage

The description below explains protection operation of the driver IC 113 against surge voltage.

Figure 7:
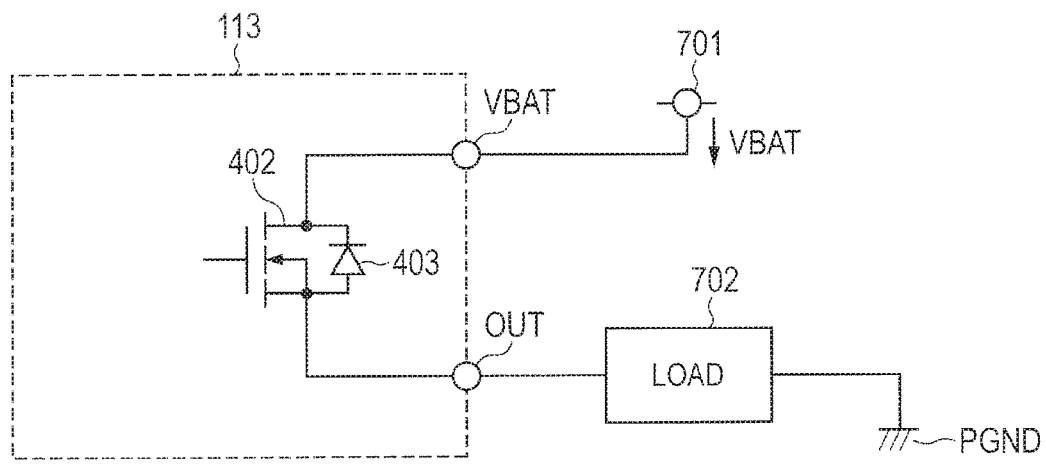
FIG. 7 is a diagram illustrating relation of coupling among an output transistor used as a high-side switch, a battery power supply, and an inductive load.

FIG. 7 is a diagram illustrating relation of coupling among an output transistor used as a high-side switch, a battery power supply, and an inductive load.

As illustrated in FIG. 7, battery voltage terminal VBAT is coupled to a battery power supply 701 and output terminal OUT is coupled to a load 702 in the driver IC 113. In other words, the output transistor 402 provided for the driver 304 in the driver IC 113 allows the drain to be coupled to the battery power supply 701 and allows the source to be coupled to the load 702. A low-potential voltage terminal of the load 702 is coupled to a reference voltage terminal (hereinafter referred to as reference voltage terminal PGND) supplied with reference voltage PGND.

Figure 8:
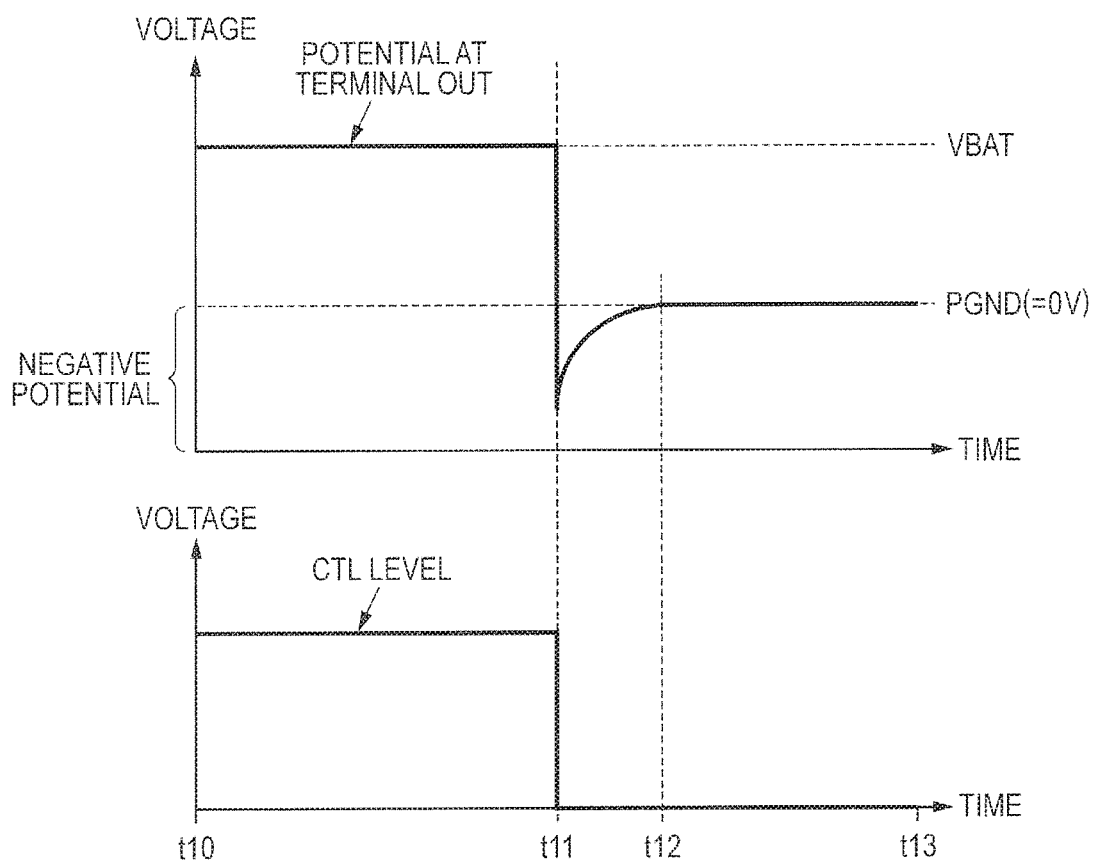
FIG. 8 is a timing chart illustrating driver operation in the coupling state illustrated in FIG. 7.

FIG. 8 is a timing chart illustrating operation of the driver 304. As illustrated in FIG. 8, the output transistor 402 turns on when control signal CTL of the driver control circuit 401 provided for the driver 304 goes to the H level (causing the gate voltage with reference to the source voltage of the output transistor 402 to be higher than or equal to the threshold voltage for the output transistor 402). An electric potential of output terminal OUT indicates a value of battery voltage terminal VBAT from the battery power supply 701 (between time t10 and t11).

The output transistor 402 then changes from the on state to the off state when control signal CTL of the driver control circuit 401 changes from the H level to the L level (causing the gate voltage with reference to the source voltage of the output transistor 402 to be smaller than the threshold voltage for the output transistor 402). At this time, the electromagnetic energy stored in the load 702 is discharged to generate a negative inverse voltage (surge voltage). Output terminal OUT temporarily indicates the negative electric potential lower than reference voltage PGND (between time t11 and t12). The electric potential of output terminal OUT then stabilizes to maintain the value corresponding to reference voltage PGND (between time t12 and t13).

Figure 9:
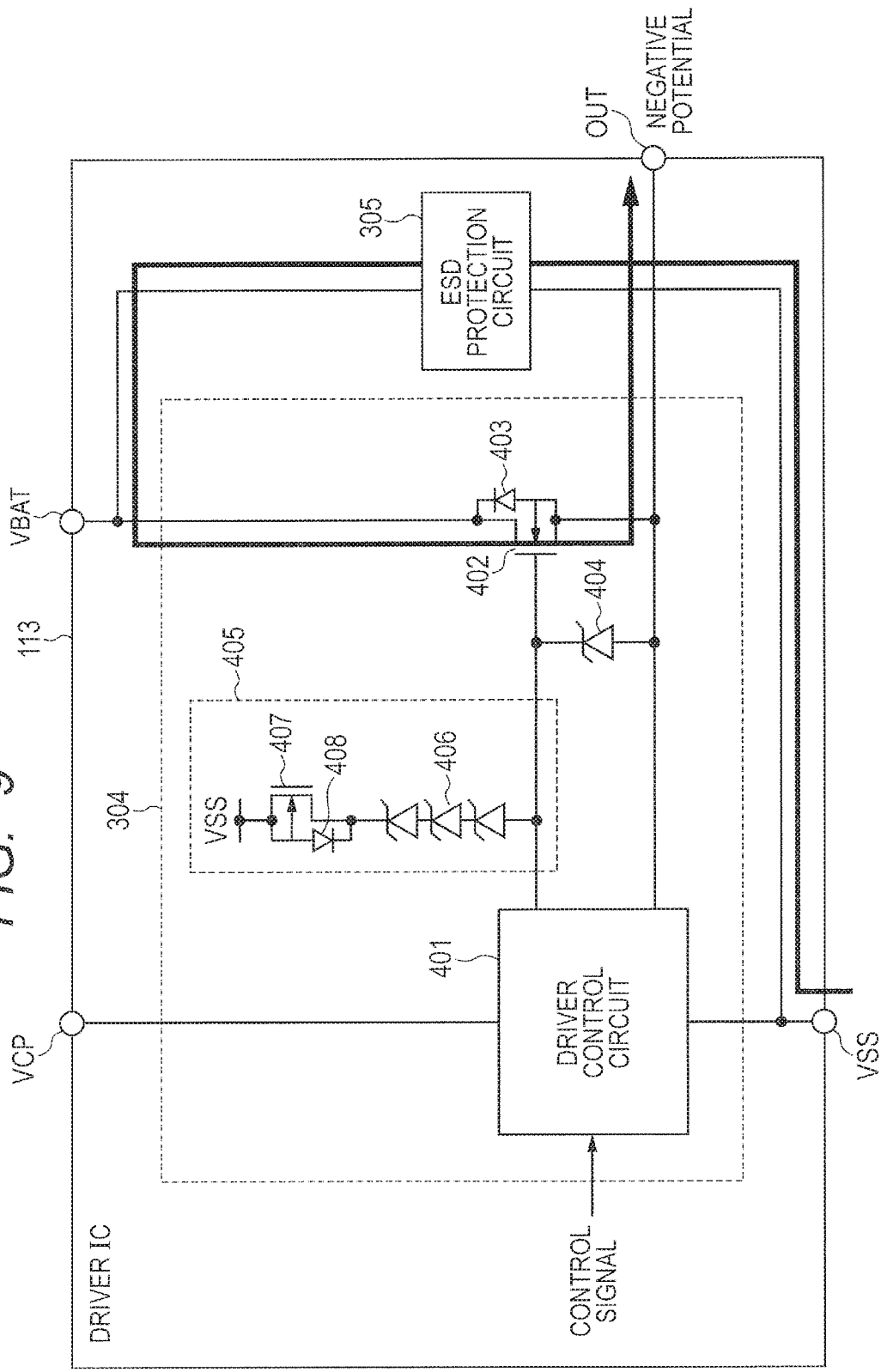
FIG. 9 is a diagram illustrating a path of an electric current flowing through the driver IC when a negative voltage is applied to output terminal OUT of the driver IC.

FIG. 9 is a diagram illustrating a path of an electric current flowing through the driver IC 113 when a negative voltage (negative surge voltage) is applied to output terminal OUT of the driver IC 113.

Suppose a negative voltage is applied to output terminal OUT of the driver IC 113 and a potential difference between gate voltage VG of the output transistor 402 and reference voltage VSS is lower than or equal to the clamp voltage settled by the negative potential clamp circuit 405. The negative potential clamp circuit 405 then does not perform clamp operation. In this case, the output transistor 402 normally switches the on-off state based on control signal CTL from the driver control circuit 401.

Alternatively, suppose a negative voltage is applied to output terminal OUT of the driver IC 113 and a potential difference between gate voltage VG of the output transistor 402 and reference voltage VSS exceeds the clamp voltage settled by the negative potential clamp circuit 405. In this case, gate voltage VG of the output transistor 402 is clamped to the clamp voltage. This causes the gate-source voltage of the output transistor 402 to be higher than or equal to the threshold voltage. The output transistor 402 is therefore forced to turn on. The conduction state is thereby enabled between battery voltage terminal VBAT and output terminal OUT. Battery voltage terminal VBAT indicates a negative electric potential approximate to the electric potential of output terminal OUT. As a result, a current flows from reference voltage terminal VSS to output terminal OUT via the body diode 602 of the MOS transistor 601 in the ESD protection circuit 305 and the output transistor 402 (arrow in FIG. 9). Namely, the ESD protection circuit 305 performs protection operation against a surge voltage.

The clamp voltage for the negative potential clamp circuit 405 may be settled so as to enable the clamp operation only when a negative voltage applied to output terminal OUT goes lower than −25 V, for example. In this case, the driver IC 113 can continue the normal drive operation until a negative voltage lower than −25 V is applied to output terminal OUT. The driver IC 113 can efficiently discharge the electromagnetic energy from the load in a short period of time.

The driver control circuit 401 controls the gate voltage of the output transistor 402 with reference to the voltage of output terminal OUT (the source voltage of the output transistor 402). An excess voltage is therefore not applied between the gate and the source of the output transistor 402 even when a negative voltage is applied to output terminal OUT. Namely, an excess voltage does not destroy the output transistor 402 even when a negative voltage is applied to output terminal OUT.

The driver IC 113 can allow the ESD protection circuit 305 to perform protection operation against a surge voltage even when a positive voltage (positive surge voltage) is applied to output terminal OUT. This will be explained with reference to FIG. 10.

Figure 10:
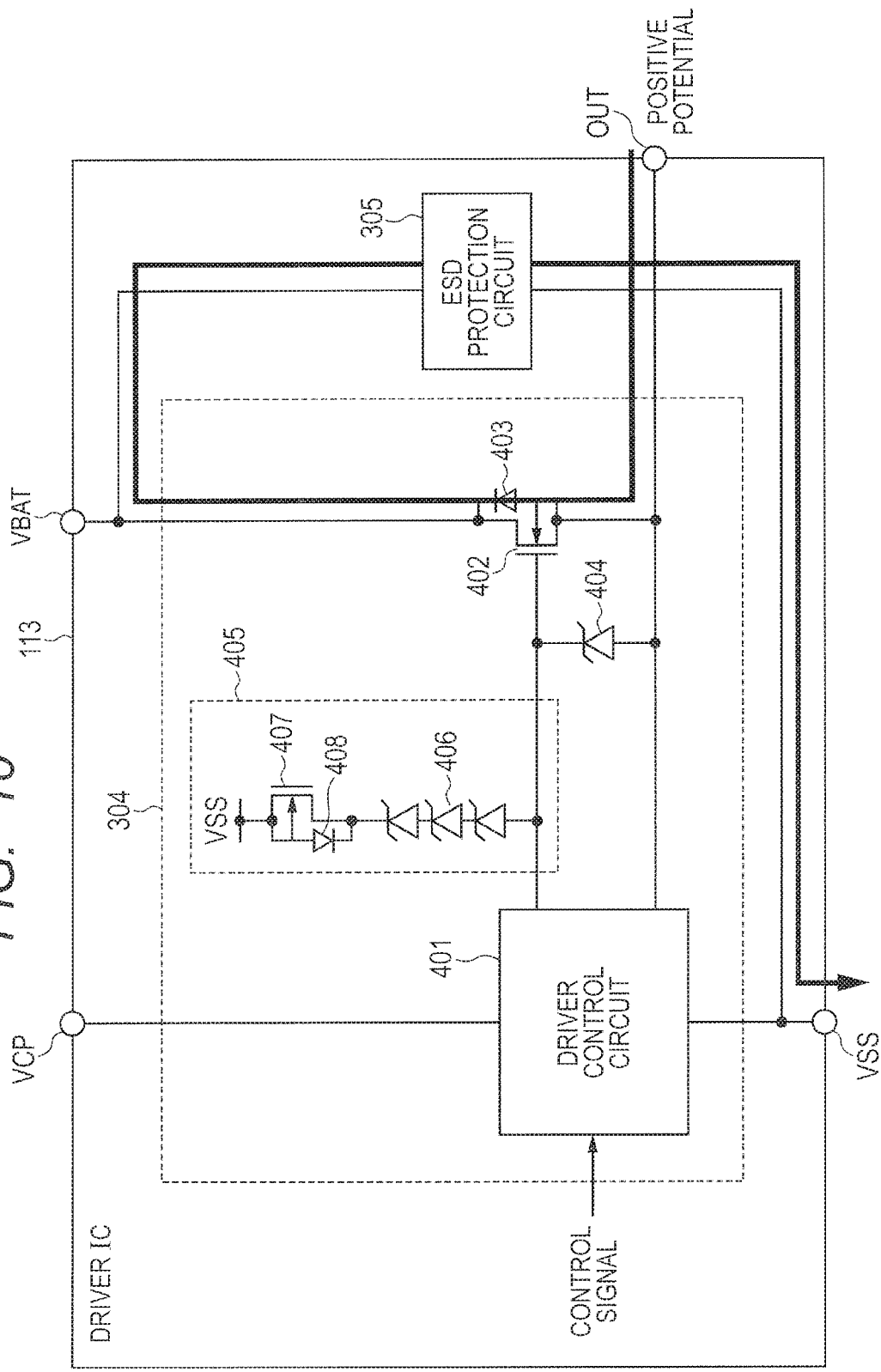
FIG. 10 is a diagram illustrating a path of an electric current flowing through the driver IC when a positive voltage is applied to output terminal OUT of the driver IC.

FIG. 10 is a diagram illustrating a path of an electric current flowing through the driver IC 113 when a positive voltage is applied to output terminal OUT of the driver IC 113.

As illustrated in FIG. 10, applying a positive voltage to output terminal OUT of the driver IC 113 causes the body diode 403 of the output transistor 402 to be conductive. Battery voltage terminal VBAT indicates a positive electric potential approximate to the electric potential of output terminal OUT. The MOS transistor 601 turns on when the voltage of battery voltage terminal VBAT exceeds the clamp voltage for the clamp circuit 605 in the ESD protection circuit 305, thus opening a current pathway between battery voltage terminal VBAT and reference voltage terminal VSS. As a result, a current flows from output terminal OUT to reference voltage terminal VSS via the body diode 403 of the output transistor 402 and the MOS transistor 601 in the ESD protection circuit 305 (arrow in FIG. 10). Namely, the ESD protection circuit 305 performs protection operation against a surge voltage.

The driver IC according to the embodiment and the ECU including the same includes the output transistor, the driver control circuit, the negative potential clamp circuit, and the ESD protection circuit. The output transistor is provided between battery voltage terminal VBAT and output terminal OUT coupled to a load. The driver control circuit switches the on-off state of the output transistor by controlling the gate voltage with reference to the source voltage of the output transistor. The negative potential clamp circuit turns on the output transistor when a negative voltage lower than the predetermined clamp voltage is applied to output terminal OUT. The ESD protection circuit is provided between battery voltage terminal VBAT and reference voltage terminal VSS. The driver IC according to the embodiment and the ECU including the same can continue the normal drive operation without destroying the output transistor even when a large negative voltage (negative surge voltage) is applied. The driver IC according to the embodiment and the electronic control unit including the same can efficiently discharge the electromagnetic energy from the load in a short period of time.

The driver IC according to the embodiment and the ECU including the same can prevent the output transistor from being destroyed by operating the ESD protection circuit even when a large positive voltage (positive surge voltage) is applied to output terminal OUT.

The embodiment has described the load coupled to output terminal OUT of the driver IC 113 by exemplifying the inductive load such as a solenoid but is not limited thereto. A load to be coupled may be so configured that a negative voltage is applied to output terminal OUT of the driver IC 113.

Second Embodiment

Figure 11:
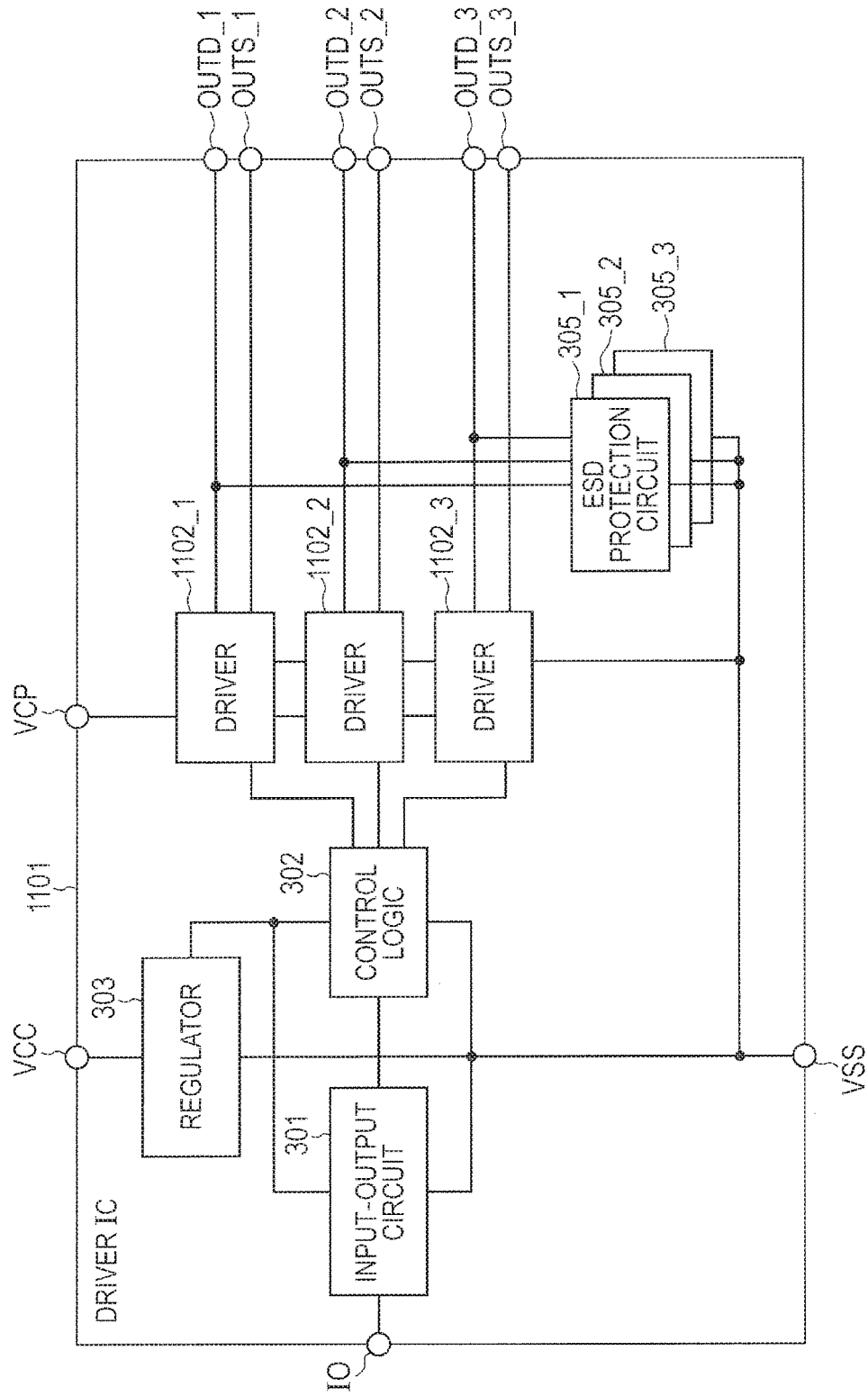
FIG. 11 is a block diagram illustrating a specific typical configuration of a driver IC according to a second embodiment.

FIG. 11 is a block diagram illustrating a specific typical configuration of a driver IC 1101 as another exemplary configuration of the driver IC 113.

As illustrated in FIG. 11, the driver IC 1101 includes an input-output circuit 301, a control logic 302, a regulator 303, three drivers 1102 (also referred to as drivers 1102_1 through 1102_3), and three ESD protection circuits 305 (ESD protection circuits 305_1 through 305_3).

The regulator 303 is provided between power-supply voltage terminal VCC and reference voltage terminal VSS and generates a predetermined internal voltage.

The input-output circuit 301 communicates with a microcomputer 111 via input-output terminal IO. The control logic 302 controls the drivers 1102_1 through 1102_3 based on a signal the input-output circuit 301 receives from the microcomputer 111, for example. An internal voltage from the regulator 303 is supplied to a high-potential voltage terminal and reference voltage VSS is supplied to a low-potential voltage terminal of each of the input-output circuit 301 and the control logic 302.

The drivers 1102_1 through 1102_3 drive loads based on a control signal from the control logic 302. For example, the driver 1102_1 drives the fuel pump 122 as a load. The driver 1102_2 drives the fuel injector 123 as a load. The driver 1102_3 drives the O2 sensor heater 128 as a load.

The drivers 1102_1 through 1102_3 are coupled to boost voltage terminal VCP, reference voltage terminal VSS, corresponding external coupling terminal QUID (also referred to as external coupling terminals OUTD_1 through OUTD_3), and corresponding external coupling terminal OUTS (also referred to as external coupling terminals OUTS_1 through OUTS_3).

The ESD protection circuits 305_1 through 305_3 are each provided between a high-potential voltage terminal (each of external coupling terminals OUTD_1 through OUTD_3) and a low-potential voltage terminal (reference voltage terminal VSS) of the drivers 1102_1 through 1102_3. The ESD protection circuits 305_1 through 305_3 protect the drivers 1102_1 through 1102_3 against ESD by absorbing a surge voltage such as ESD applied to external coupling terminals OUTD_1 through OUTD_3.

Specific Typical Configuration of the Driver 1102

Figure 12:
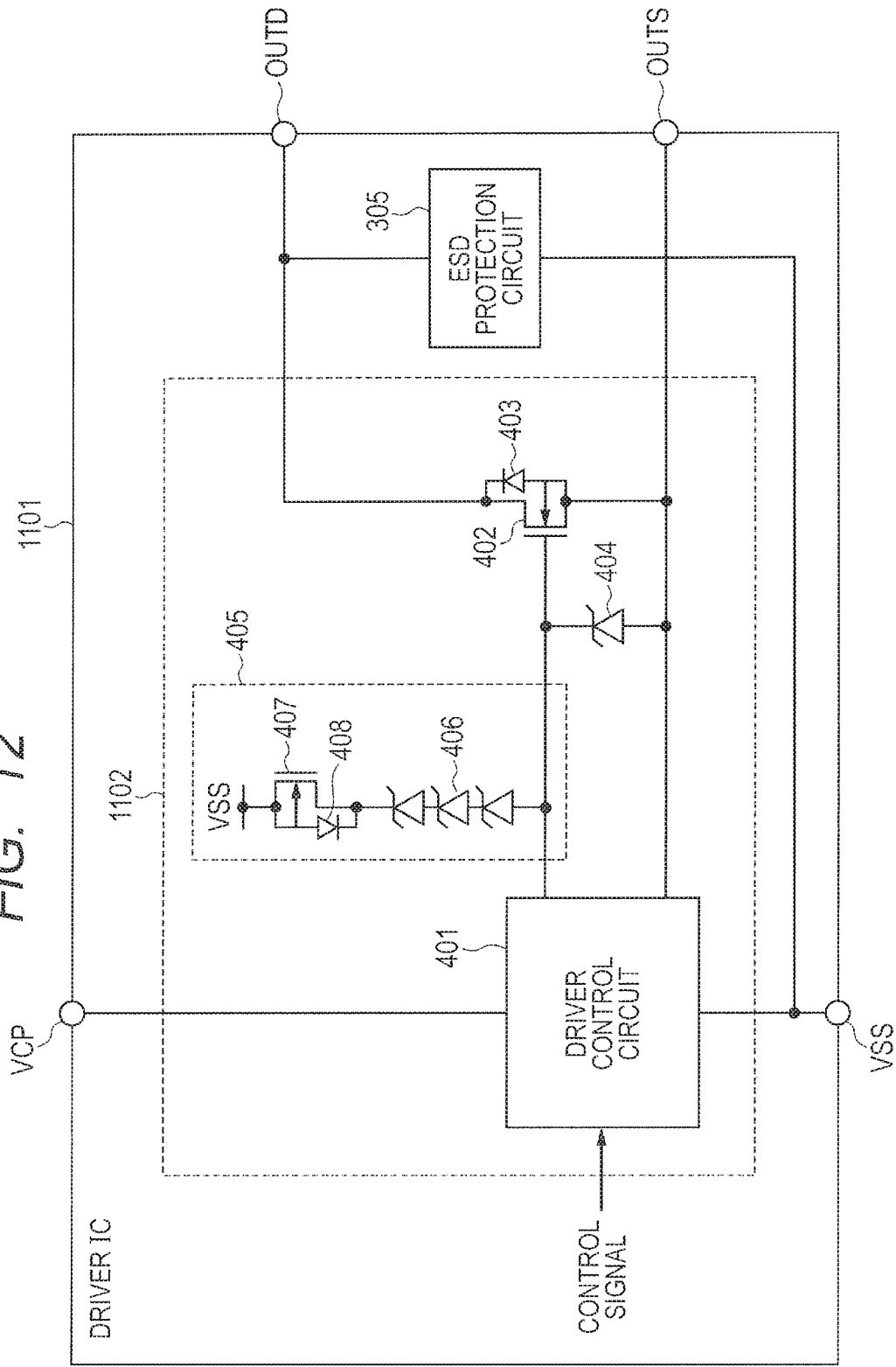
FIG. 12 is a diagram illustrating a specific typical configuration of a driver in the driver IC illustrated in FIG. 11.

FIG. 12 is a diagram illustrating a specific typical configuration of the driver 1102 in the driver IC 1101. FIG. 12 illustrates the driver 1102 and the corresponding ESD protection circuit 305 as constituent elements of the driver IC 1101.

As illustrated in FIG. 12, the driver 1102 is configured similarly to the driver 304. However, the output transistor 402 is provided between external coupling terminal OUTD and external coupling terminal OUTS, not between battery voltage terminal VBAT and output terminal OUT. The embodiment describes the inductive load as an example of a load coupled to external coupling terminal QUID or external coupling terminal OUTS.

The other configurations of the driver 1102 are comparable to those of the driver 304 and a description is therefore omitted.

Specific Typical Configuration of the Driver Control Circuit 401

Figure 13:
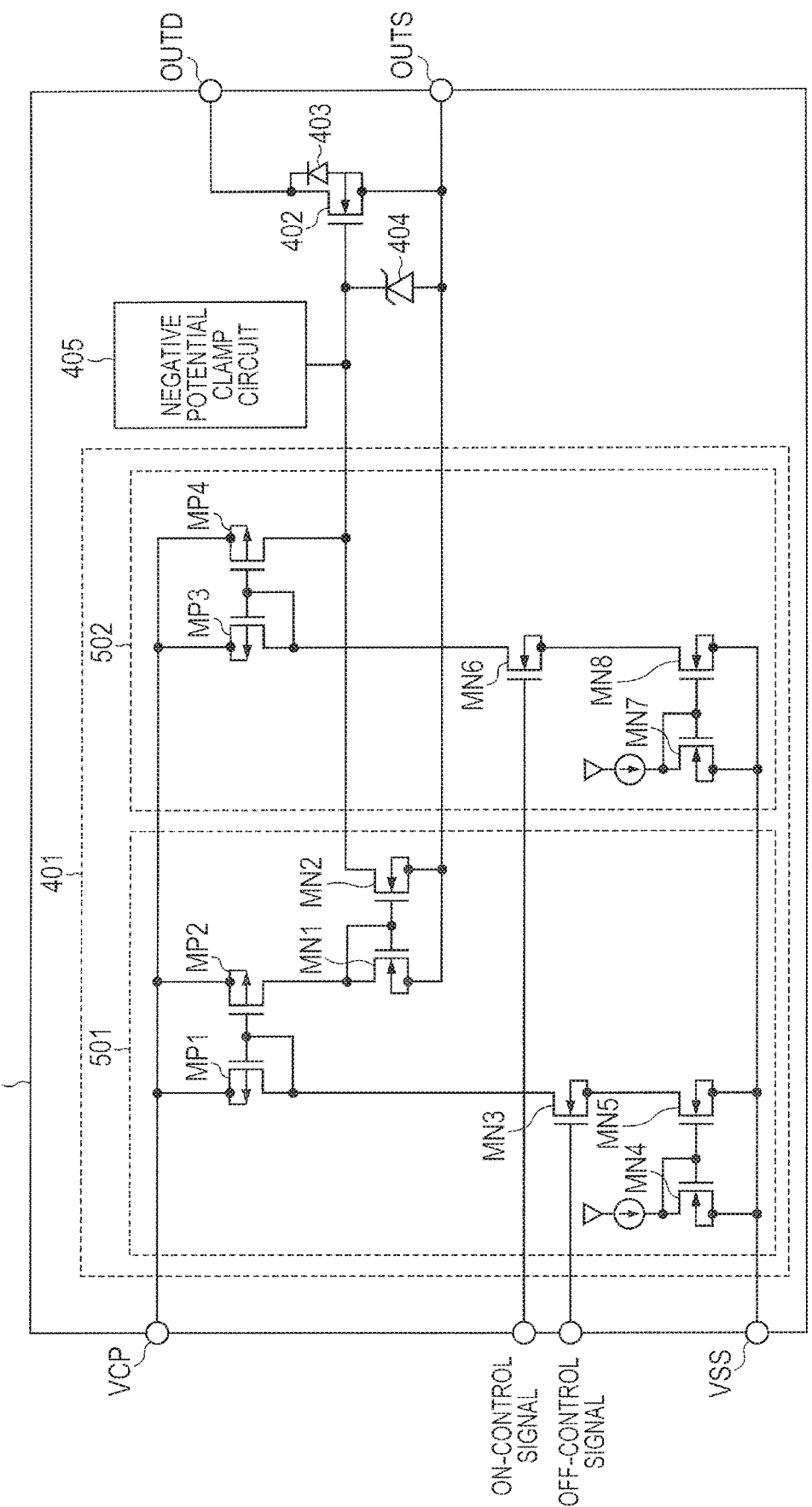
FIG. 13 is a diagram illustrating a specific typical configuration of a driver control circuit provided in the driver IC illustrated in FIG. 12.

FIG. 13 is a circuit diagram illustrating a specific typical configuration of the driver control circuit 401 in the driver 1102. With reference to FIG. 13, the specific typical configuration of the driver control circuit 401 in the driver 1102 is similar to that of the driver control circuit 401 in the driver 304 and a description is therefore omitted.

Protection Operation Against Surge Voltage Performed by the Driver IC 1101 Using High-Side Configuration The description below explains protection operation against surge voltage performed by the driver IC 1101 using a high-side configuration.

Figure 14:
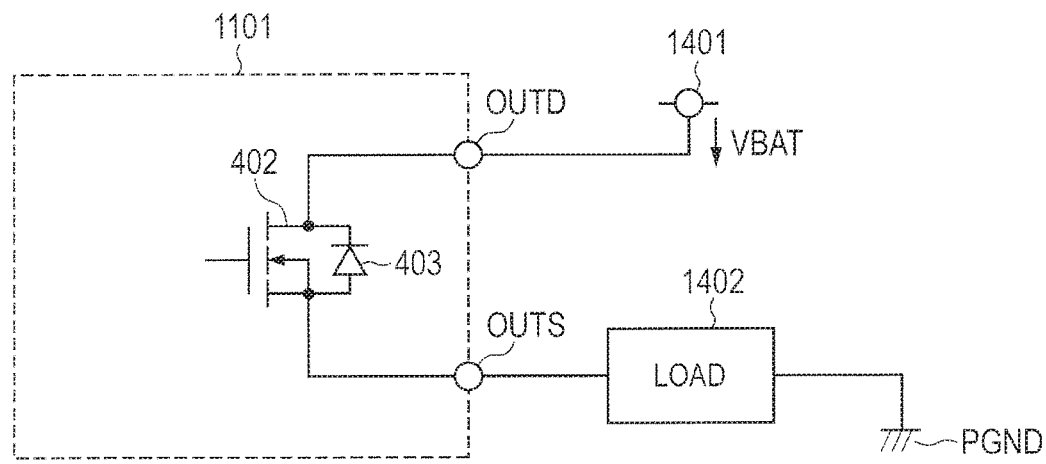
FIG. 14 is a diagram illustrating relation of coupling among an output transistor used as a high-side switch, a battery power supply, and an inductive load.

FIG. 14 is a diagram illustrating relation of coupling among an output transistor used as a high-side switch, a battery power supply, and an inductive load.

In the driver IC 1101 as illustrated in FIG. 14, external coupling terminal OUTD is coupled to a battery power supply 1401 and external coupling terminal OUTS is coupled to a load 1402. In other words, the output transistor 402 provided for the driver 1102 in the driver IC 1101 couples the drain to the battery power supply 1401 and couples the source to the load 1402. A low-potential voltage terminal of the load 1402 is coupled to reference voltage PGND.

Figure 15:
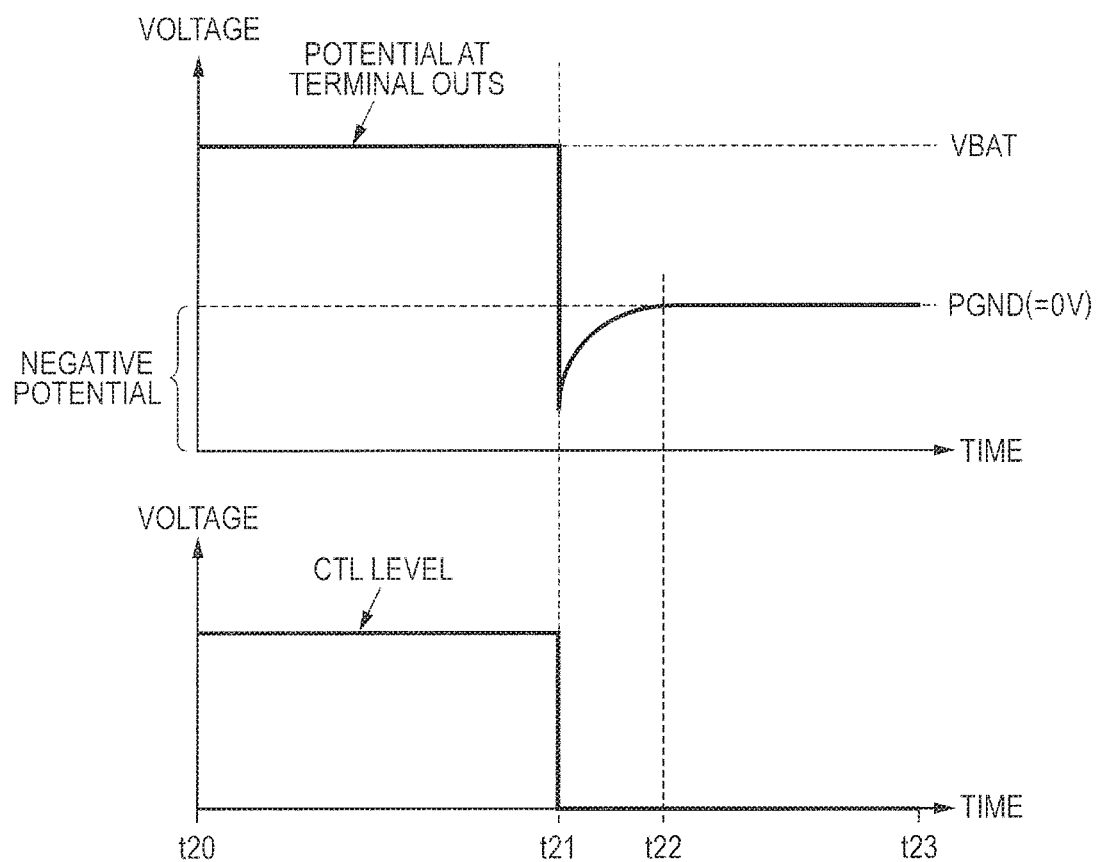
FIG. 15 is a timing chart illustrating driver operation in the coupling state illustrated in FIG. 14.

FIG. 15 is a timing chart illustrating operation of the driver 1102. As illustrated in FIG. 15, the output transistor 402 turns on when control signal CTL of the driver control circuit 401 provided for the driver 1102 goes to the H level (causing the gate voltage with reference to the source voltage of the output transistor 402 to be higher than or equal to the threshold voltage for the output transistor 402). An electric potential of external coupling terminal OUTS indicates a value of battery voltage terminal VBAT from the battery power supply 1401 (between time t20 and t21).

The output transistor 402 then changes from the on state to the off state when control signal CTL of the driver control circuit 401 changes from the H level to the L level (causing the gate voltage with reference to the source voltage of the output transistor 402 to be smaller than the threshold voltage for the output transistor 402). At this time, the electromagnetic energy stored in the load 1402 is discharged to generate a negative inverse voltage (surge voltage). Output terminal OUTS temporarily indicates the negative electric potential lower than reference voltage PGND (between time t21 and t22). The electric potential of output terminal OUTS then stabilizes to maintain the value corresponding to reference voltage PGND (between time t22 and t23).

Figure 16:
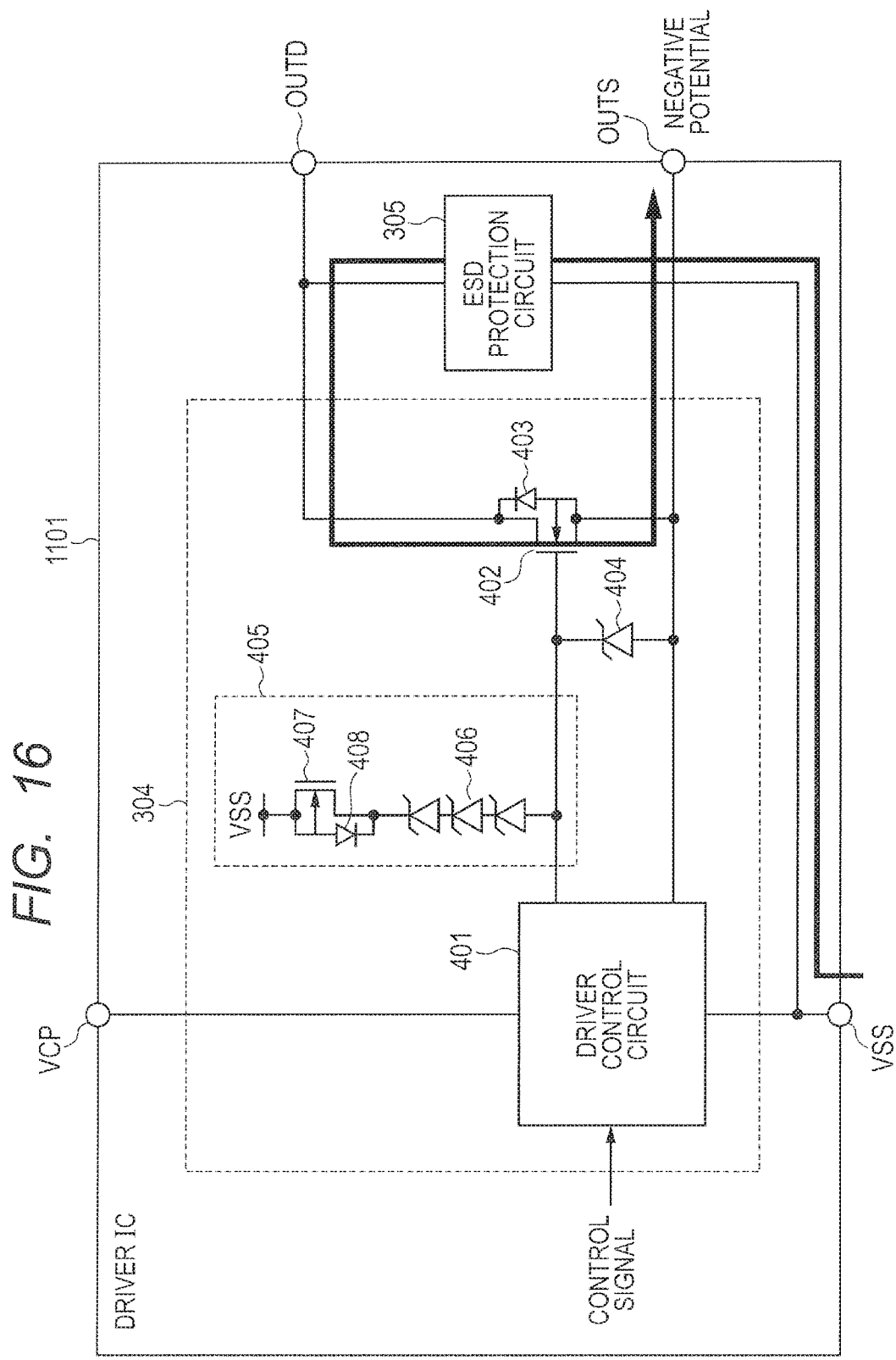
FIG. 16 is a diagram illustrating a path of an electric current flowing through the driver IC when a negative voltage is applied to output terminal OUTS of the driver IC.

FIG. 16 is a diagram illustrating a path of an electric current flowing through the driver IC 1101 when a negative voltage (negative surge voltage) is applied to external coupling terminal OUTS of the driver IC 1101.

Suppose a negative voltage is applied to external coupling terminal OUTS of the driver IC 1101 and a potential difference between gate voltage VG of the output transistor 402 and reference voltage VSS is lower than or equal to the clamp voltage settled by the negative potential clamp circuit 405. The negative potential clamp circuit 405 then does not perform clamp operation. In this case, the output transistor 402 normally switches the on-off state based on control signal CTL from the driver control circuit 401.

Alternatively, suppose a negative voltage is applied to external coupling terminal OUTS of the driver IC 1101 and a potential difference between gate voltage VG of the output transistor 402 and reference voltage VSS exceeds the clamp voltage settled by the negative potential clamp circuit 405. In this case, gate voltage VG of the output transistor 402 is clamped to the clamp voltage. This causes the gate-source voltage of the output transistor 402 to be higher than or equal to the threshold voltage. The output transistor 402 is therefore forced to turn on. The conduction state is thereby enabled between external coupling terminal OUTD and external coupling terminal OUTS. External coupling terminal OUTD indicates a negative electric potential approximate to the electric potential of external coupling terminal OUTS. As a result, a current flows from reference voltage terminal VSS to external coupling terminal OUTS via the body diode 602 of the MOS transistor 601 in the ESD protection circuit 305 and the output transistor 402 (arrow in FIG. 16). Namely, the ESD protection circuit 305 performs protection operation against a surge voltage.

The clamp voltage for the negative potential clamp circuit 405 may be settled so as to enable the clamp operation only when a negative voltage applied to external coupling terminal OUTS goes lower than −25 V, for example. In this case, the driver IC 1101 can continue the normal drive operation until a negative voltage lower than −25 V is applied to external coupling terminal OUTS. The driver IC 1101 can efficiently discharge the electromagnetic energy from the load in a short period of time.

The driver control circuit 401 controls the gate voltage of the output transistor 402 with reference to the voltage of external coupling terminal OUTS (the source voltage of the output transistor 402). An excess voltage is therefore not applied between the gate and the source of the output transistor 402 even when a negative voltage is applied to external coupling terminal OUTS. Namely, an excess voltage does not destroy the output transistor 402 even when a negative voltage is applied to external coupling terminal OUTS.

The driver IC 1101 can allow the ESD protection circuit 305 to perform protection operation against a surge voltage even when a positive voltage (positive surge voltage) is applied to external coupling terminal OUTS. This will be explained with reference to FIG. 17.

Figure 17:
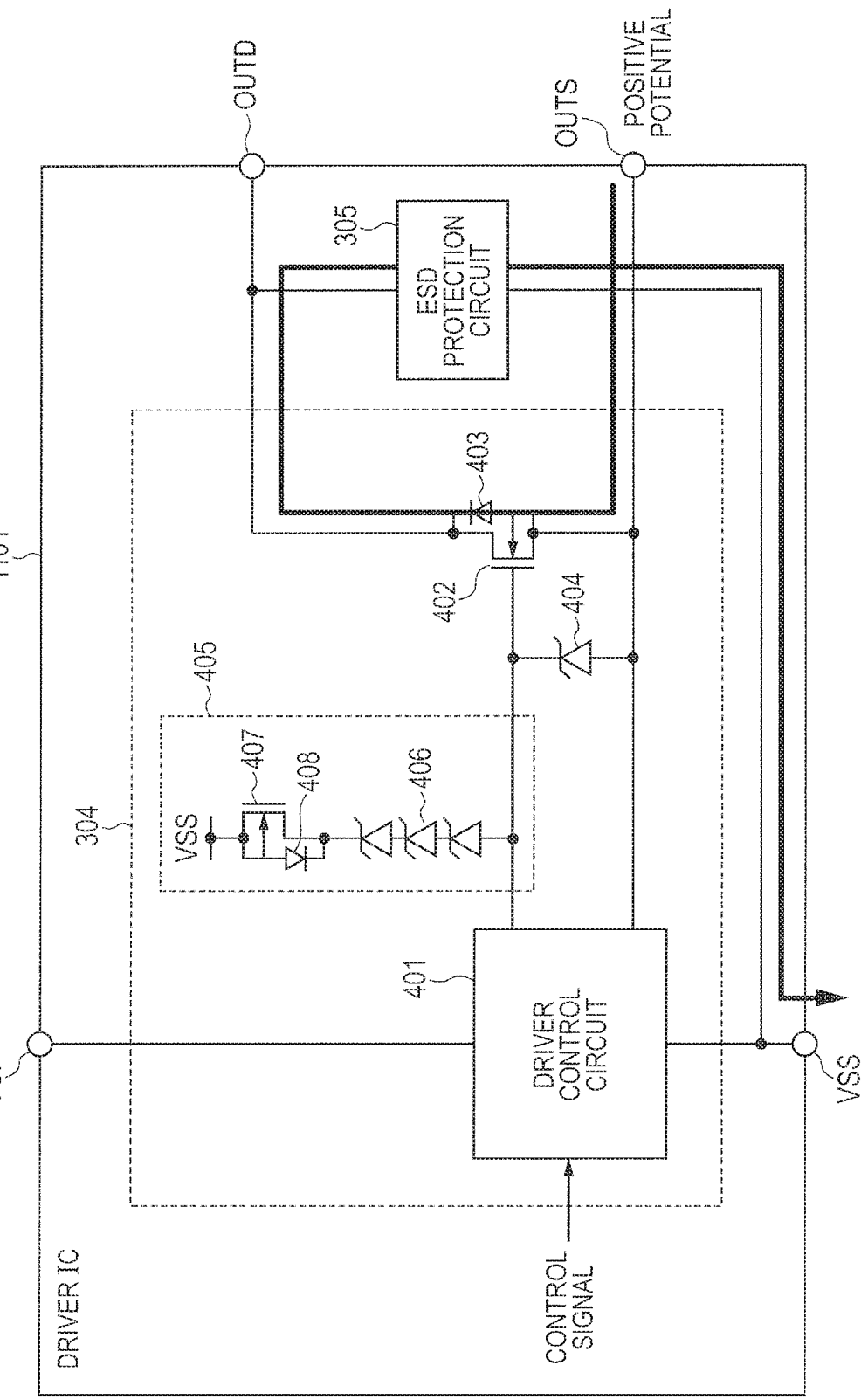
FIG. 17 is a diagram illustrating a path of an electric current flowing through the driver IC when a positive voltage is applied to output terminal OUTS of the driver IC.

FIG. 17 is a diagram illustrating a path of an electric current flowing through the driver IC 1101 when a positive voltage is applied to external coupling terminal OUTS of the driver IC 1101.

As illustrated in FIG. 17, applying a positive voltage to external coupling terminal OUTS of the driver IC 1101 causes the body diode 403 of the output transistor 402 to be conductive. External coupling terminal OUTD indicates a positive electric potential approximate to the electric potential of external coupling terminal OUTS. The MOS transistor 601 turns on when the voltage of external coupling terminal OUTD exceeds the clamp voltage for the clamp circuit 605 in the ESD protection circuit 305, thus opening a current pathway between external coupling terminal OUTD and reference voltage terminal VSS. As a result, a current flows from external coupling terminal OUTS to reference voltage terminal VSS via the body diode 403 of the output transistor 402 and the MOS transistor 601 in the ESD protection circuit 305 (arrow in FIG. 17). Namely, the ESD protection circuit 305 performs protection operation against a surge voltage.

Protection Operation Against Surge Voltage Performed by the Driver IC 1101 Using Low-Side Configuration The description below explains protection operation against surge voltage performed by the driver IC 1101 using a low-side configuration.

Figure 18:
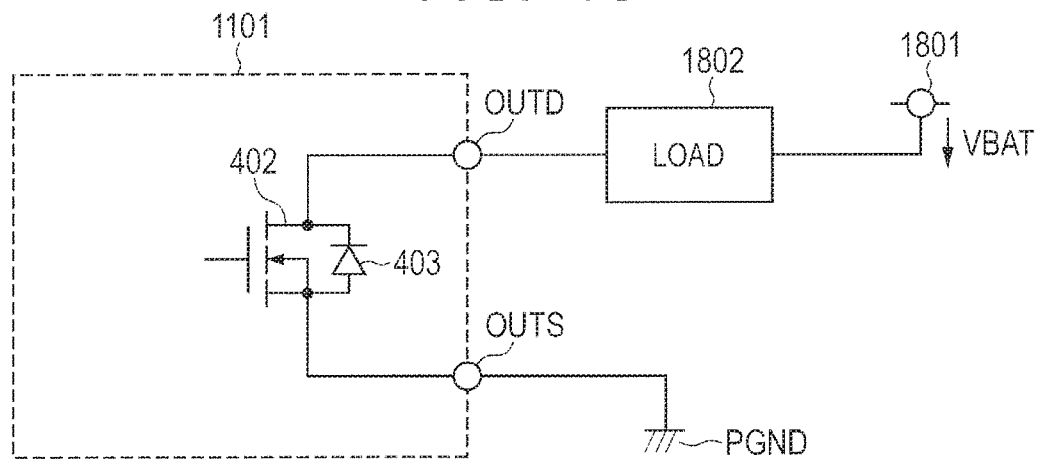
FIG. 18 is a diagram illustrating relation of coupling among an output transistor used as a low-side switch, a battery power supply, and an inductive load.

FIG. 18 is a diagram illustrating relation of coupling among an output transistor used as a low-side switch, a battery power supply, and an inductive load.

As illustrated in FIG. 18, a load 1802 is provided between external coupling terminal OUTD of the driver IC 1101 and a battery power supply 1801. External coupling terminal OUTS of the driver IC 1101 is coupled to reference voltage PGND.

Figure 19:
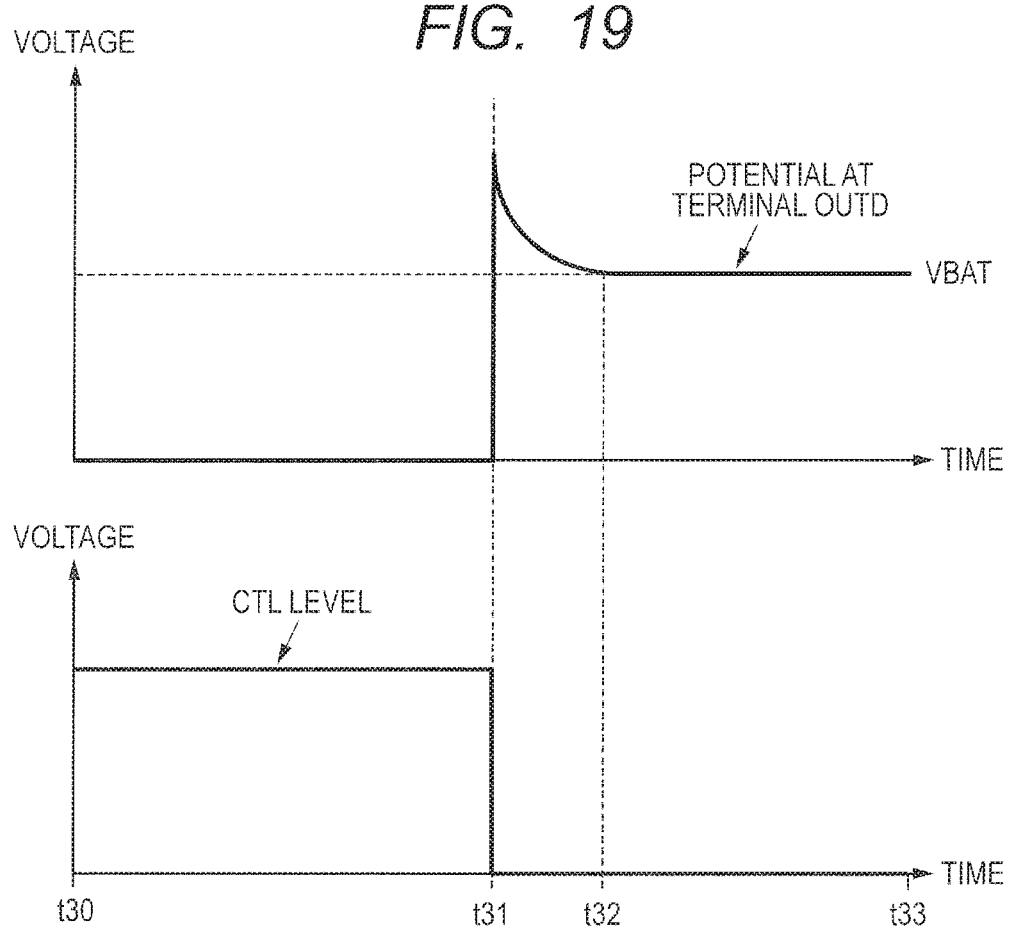
FIG. 19 is a timing chart illustrating driver operation in the coupling state illustrated in FIG. 18.

FIG. 19 is a timing chart illustrating operation of the driver 1102. As illustrated in FIG. 19, the output transistor 402 turns on when control signal CTL of the driver control circuit 401 provided for the driver 1102 goes to the H level (causing the gate voltage with reference to the source voltage of the output transistor 402 to be higher than or equal to the threshold voltage for the output transistor 402). An electric potential of external coupling terminal OUTD indicates a value of reference voltage PGND (between time t30 and t31).

The output transistor 402 then changes from the on state to the off state when control signal CTL of the driver control circuit 401 changes from the H level to the L level (causing the gate voltage with reference to the source voltage of the output transistor 402 to be smaller than the threshold voltage for the output transistor 402). At this time, the electromagnetic energy stored in the load 1802 is discharged to generate a positive inverse voltage (surge voltage). External coupling terminal OUTD temporarily indicates the positive electric potential higher than battery voltage terminal VBAT (between time t31 and t32). The electric potential of external coupling terminal OUTD then stabilizes to maintain the value corresponding to battery voltage terminal VBAT (between time t32 and t33).

Figure 20:
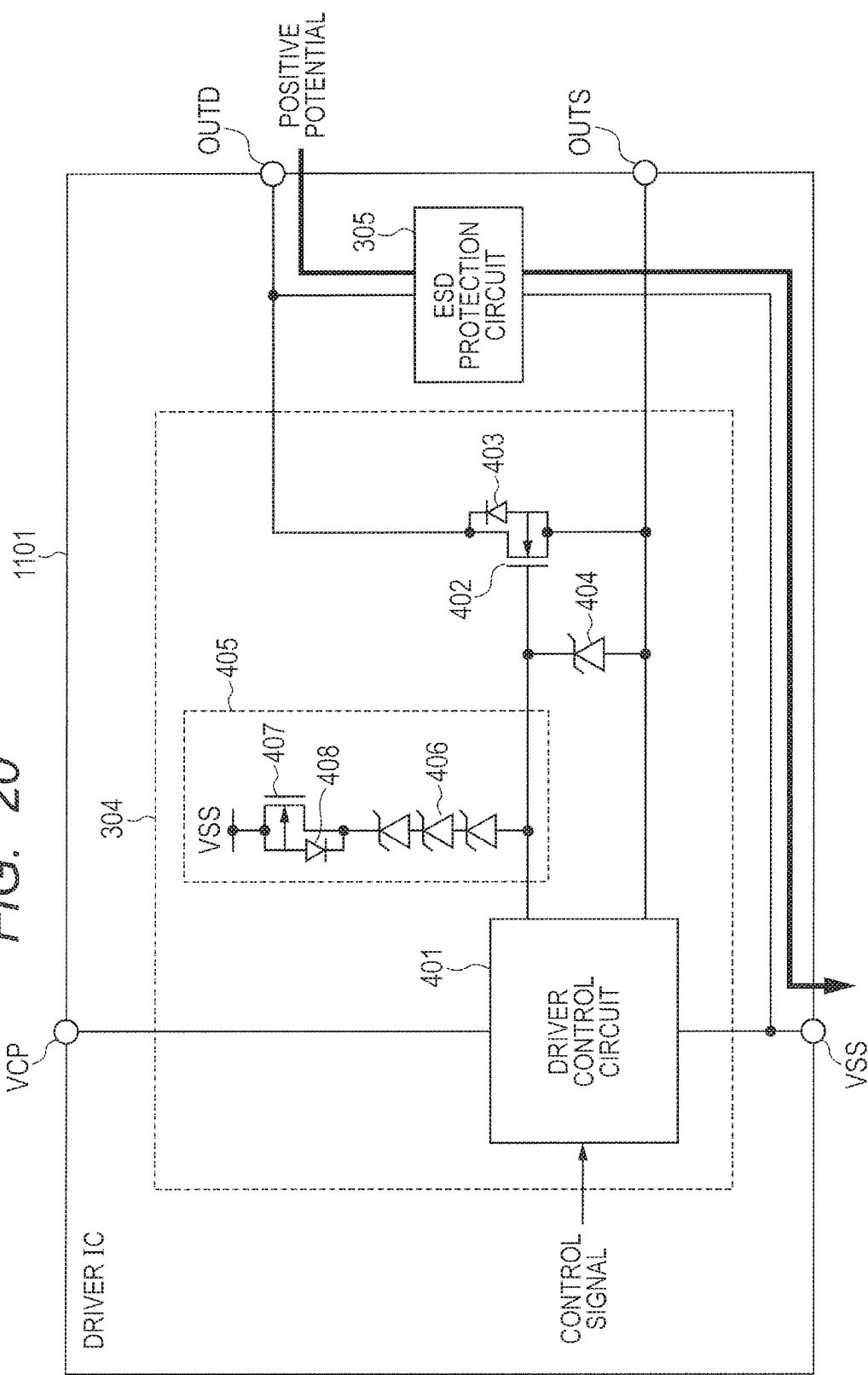
FIG. 20 is a diagram illustrating a path of an electric current flowing through the driver IC when a positive voltage is applied to output terminal OUTD of the driver IC.

FIG. 20 is a diagram illustrating a path of an electric current flowing through the driver IC 1101 when a positive voltage (positive surge voltage) is applied to external coupling terminal OUTD of the driver IC 1101.

As illustrated in FIG. 20, suppose a positive voltage is applied to external coupling terminal OUTD of the driver IC 1101. In this case, the MOS transistor 601 turns on when the voltage of external coupling terminal OUTD exceeds the clamp voltage for the clamp circuit 605 in the ESD protection circuit 305, thus opening a current pathway between external coupling terminal OUTD and reference voltage terminal VSS. As a result, a current flows from external coupling terminal OUTD to reference voltage terminal VSS via the MOS transistor 601 in the ESD protection circuit 305 (arrow in FIG. 20). Namely, the ESD protection circuit 305 performs protection operation against a surge voltage.

The driver IC 1101 can allow the ESD protection circuit 305 to perform protection operation against a surge voltage even when a negative voltage (negative surge voltage) is applied to external coupling terminal OUTD. This will be explained with reference to FIG. 21.

Figure 21:
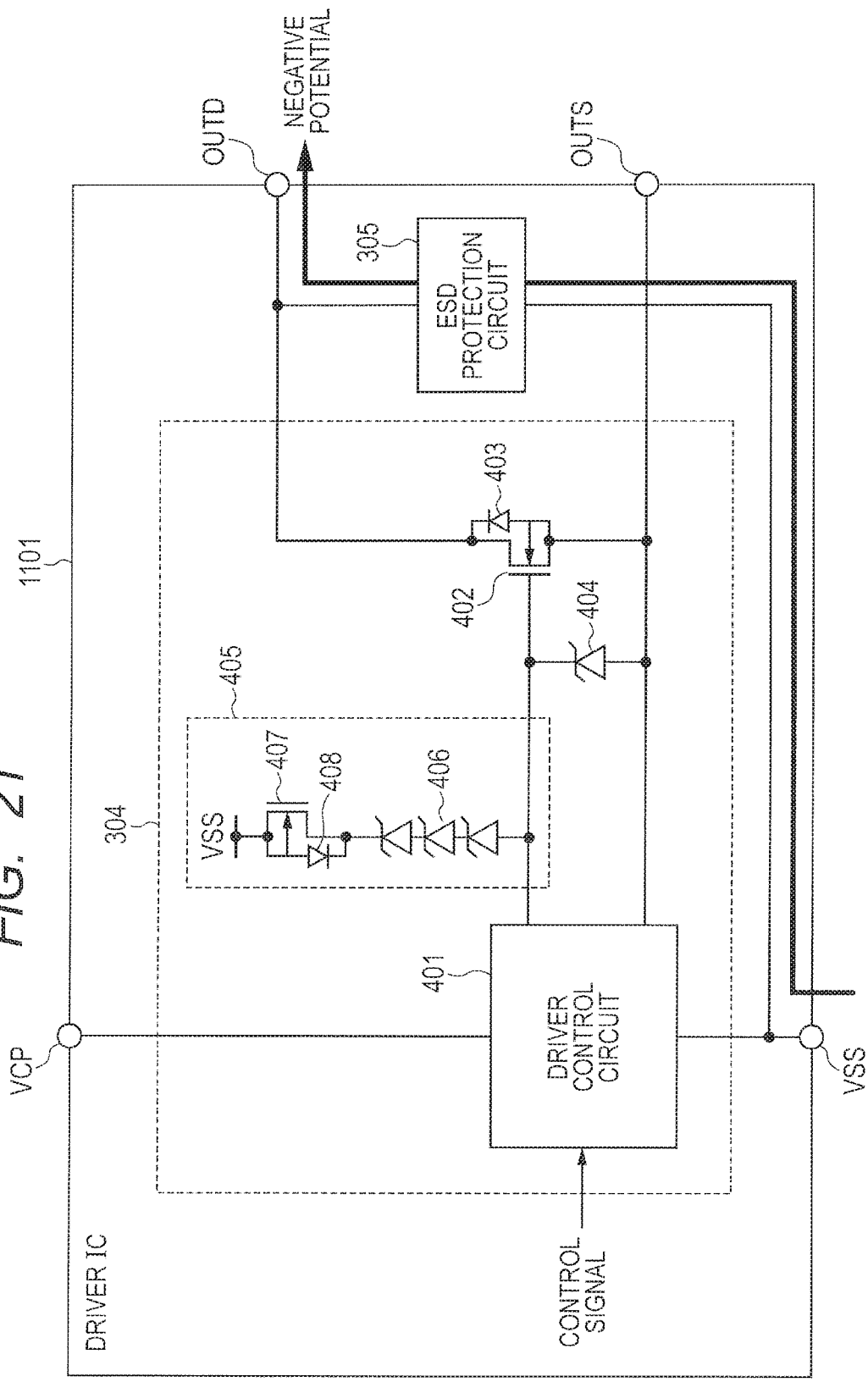
FIG. 21 is a diagram illustrating a path of an electric current flowing through the driver IC when a negative voltage is applied to output terminal OUTD of the driver IC.

FIG. 21 is a diagram illustrating a path of an electric current flowing through the driver IC 1101 when a negative voltage is applied to external coupling terminal OUTD of the driver IC 1101.

As illustrated in FIG. 21, applying a negative voltage to external coupling terminal OUTD of the driver IC 1101 causes a current to flow from reference voltage terminal VSS to external coupling terminal OUTD via the body diode 602 of the MOS transistor 601 in the ESD protection circuit 305 (arrow in FIG. 21). Namely, the ESD protection circuit 305 performs protection operation against a surge voltage.

The driver IC according to the embodiment and the ECU including the same includes the output transistor, the driver control circuit, the negative potential clamp circuit, and the ESD protection circuit. The output transistor is provided between external coupling terminal OUTD and external coupling terminal OUTS. The driver control circuit switches the on-off state of the output transistor by controlling the gate voltage with reference to the source voltage of the output transistor. The negative potential clamp circuit turns on the output transistor when a negative voltage lower than the predetermined clamp voltage is applied to external coupling terminal OUTS. The ESD protection circuit is provided between external coupling terminal OUTD and reference voltage terminal VSS.

The driver IC according to the embodiment and the ECU including the same may be used as a high-side driver, for example, and can thereby continue the normal drive operation without destroying the output transistor even when a large negative voltage (negative surge voltage) is applied to external coupling terminal OUTS. The driver IC according to the embodiment and the electronic control system including the same can efficiently discharge the electromagnetic energy from the load in a short period of time.

The driver IC according to the embodiment and the ECU including the same may be used as a high-side driver, for example, and can prevent the output transistor from being destroyed by operating the ESD protection circuit even when a large positive voltage (positive surge voltage) is applied to external coupling terminal OUTS.

The driver IC according to the embodiment and the ECU including the same can be used as not only a high-side driver, but also a low-side driver. The driver IC according to the embodiment and the ECU including the same may be used as a low-side driver, for example, and can prevent the output transistor from being destroyed by operating the ESD protection circuit even when a large negative voltage is applied to external coupling terminal OUTD.

The embodiment has described the load coupled to external coupling terminal OUTS or external coupling terminal OUTD of the driver IC 1101 by exemplifying the inductive load such as a solenoid but is not limited thereto. A load to be coupled may be so configured that a negative or positive surge voltage is applied to external coupling terminal OUTS or external coupling terminal OUTD of the driver IC 1101.

While there has been described the specific embodiment of the invention made by the inventors, it is to be distinctly understood that the present invention is not limited to the above-mentioned embodiment and may be embodied in various modifications without departing from the spirit and scope of the invention.

The semiconductor device according to the above-mentioned embodiments may use a reversed conductivity type (p-type or n-type) of semiconductor substrates, semiconductor layers, or diffusion layers (diffusion regions), for example. One of the conductivity types, p-type and n-type, may correspond to a first conductivity type and the other conductivity type may correspond to a second conductivity type. In this case, the first conductivity type can be designated as p-type and the second conductivity type can be designated as n-type. Contrastingly, the first conductivity type can be designated as n-type and the second conductivity type can be designated as p-type.

What is claimed is:

1. A semiconductor device comprising:
   an output transistor provided between an input terminal supplied with electric power from outside and an output terminal coupled to a load;
   a control circuit configured to switch the output transistor between on and off by controlling a gate voltage of the output transistor with reference to a voltage at the output terminal;
   a negative potential clamp circuit configured to turn on the output transistor regardless of control from the control circuit when a negative voltage lower than a predetermined voltage is applied to the output terminal, wherein the negative potential clamp circuit is provided between a gate of the output transistor and a reference voltage terminal; and
   a surge protection circuit provided between the input terminal and the reference voltage terminal and configured to enter a conduction state when a surge voltage is applied to the input terminal,
   wherein the negative potential clamp circuit includes:
      one or more Zener diodes forward provided from the gate of the output transistor to the reference voltage terminal;
      an N-channel MOS transistor provided between the one or more Zener diodes and the reference voltage terminal; and
      a backflow prevention diode serially and backward provided for the one or more Zener diodes, wherein the backflow prevention diode is provided between a source and a drain of the N-channel MOS transistor.

2. The semiconductor device according to claim 1, wherein the negative potential clamp circuit is configured to clamp the gate voltage of the output transistor to a voltage corresponding to the predetermined voltage when the negative voltage lower than the predetermined voltage is applied to the output terminal.

3. The semiconductor device according to claim 1, further comprising:
   a first gate protection diode provided between the gate of the output transistor and the output terminal.

4. The semiconductor device according to claim 1, wherein the surge protection circuit includes:
   a MOS transistor provided between the input terminal and the reference voltage terminal;
   a clamp circuit provided between a gate of the MOS transistor and the input terminal and entering a conduction state when the surge voltage is applied to the input terminal; and
   a resistive element provided between the gate of the MOS transistor and the reference voltage terminal.

5. The semiconductor device according to claim 4, wherein the surge protection circuit further includes:
   a second gate protection diode provided between the gate of the MOS transistor and the reference voltage terminal in parallel with the resistive element.

6. The semiconductor device according to claim 1, wherein the load is an inductive load.

7. An electronic control system comprising:
   a load; and
   the semiconductor device according to claim 1 that controls electric power supplied to the load.

8. The electronic control system according to claim 7, wherein the load is an inductive load.

9. A semiconductor device comprising:
   an output transistor provided between a first external coupling terminal and a second external coupling terminal;
   a control circuit configured to switch the output transistor between on and off by controlling a gate voltage of the output transistor with reference to a voltage of the second external coupling terminal;
   a negative potential clamp circuit configured to turn on the output transistor regardless of control from the control circuit when a negative voltage lower than a predetermined voltage is applied to the second external coupling terminal, wherein the negative potential clamp circuit is provided between a gate of the output transistor and a reference voltage terminal; and
   a surge protection circuit provided between the first external coupling terminal and the reference voltage terminal and configured to enter a conduction state when a surge voltage is applied to the first external coupling terminal,
   wherein the negative potential clamp circuit includes:
      one or more Zener diodes forward provided from the gate of the output transistor to the reference voltage terminal;

an N-channel MOS transistor provided between the one or more Zener diodes and the reference voltage terminal; and a backflow prevention diode serially and backward provided for the one or more Zener diodes, wherein the backflow prevention diode is provided between a source and a drain of the N-channel MOS transistor.

10. The semiconductor device according to claim 9, wherein the negative potential clamp circuit is provided between the gate of the output transistor and the reference voltage terminal, and wherein the negative potential clamp circuit is configured to clamp the gate voltage of the output transistor to a voltage corresponding to the predetermined voltage when the negative voltage lower than the predetermined voltage is applied to the second external coupling terminal.

11. The semiconductor device according to claim 9, further comprising:

a first gate protection diode provided between a gate of the output transistor and the second external coupling terminal.

12. The semiconductor device according to claim 9, wherein the surge protection circuit includes:

a MOS transistor provided between the first external coupling terminal and the reference voltage terminal;

a clamp circuit provided between a gate of the MOS transistor and the first external coupling terminal, and configured to enter a conduction state when the surge voltage is applied to the first external coupling terminal; and a resistive element provided between the gate of the MOS transistor and the reference voltage terminal.

13. The semiconductor device according to claim 12, wherein the surge protection circuit further includes:

a second gate protection diode provided between the gate of the MOS transistor and the reference voltage terminal in parallel with the resistive element.

14. An electronic control system comprising:

a load; and the semiconductor device according to claim 9 in which the first external coupling terminal is coupled to a power supply source and the second external coupling terminal is coupled to the load.

15. The electronic control system according to claim 14, wherein the load is an inductive load.

16. An electronic control system comprising:

a load; and the semiconductor device according to claim 9 in which the first external coupling terminal is coupled to the load and the second external coupling terminal is coupled to a power supply source.

17. The electronic control system according to claim 16, wherein the load is an inductive load.

* * * * *